(12) United States Patent
Tanaka et al.

(10) Patent No.: US 6,515,648 B1
(45) Date of Patent: Feb. 4, 2003

(54) SHIFT REGISTER CIRCUIT, DRIVING CIRCUIT OF DISPLAY DEVICE, AND DISPLAY DEVICE USING THE DRIVING CIRCUIT

(75) Inventors: Yukio Tanaka, Kanagawa (JP); Keisuke Hayashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 167 days.

(21) Appl. No.: 09/650,072

(22) Filed: Aug. 29, 2000

(30) Foreign Application Priority Data

Aug. 31, 1999 (JP) .......................................... 11-244808

(51) Int. Cl.[7] ................................................. G09G 3/36
(52) U.S. Cl. .......................... 345/100; 345/98; 345/559
(58) Field of Search .......................... 345/98, 100, 559, 345/197, 93; 377/64–81, 69

(56) References Cited

U.S. PATENT DOCUMENTS

| | | | |
|---|---|---|---|
| 5,594,569 A | | 1/1997 | Konuma et al. ............. 349/122 |
| 5,643,826 A | | 7/1997 | Ohtani et al. .................. 437/88 |
| 5,682,175 A | * | 10/1997 | Kitamura |
| 5,808,595 A | * | 9/1998 | Kubota et al. |
| 5,923,962 A | | 7/1999 | Ohtani et al. ................ 438/150 |
| 5,956,009 A | * | 9/1999 | Zhang et al. |
| 6,232,939 B1 | * | 5/2001 | Saito et al. |

FOREIGN PATENT DOCUMENTS

JP          7-130652          5/1995

OTHER PUBLICATIONS

Inui, S. et al, "Thresholdless Antiferroelectricity in Liquid Crystals and its Application to Displays," *J. Mater Chem.*, vol. 6, No. 4, pp. 671–673, 1996.

Yoshida, T. et al, "A Full–Color Thresholdless Antiferroelectric LCD Exhibiting Wide Viewing Angle with Fast Response Time," SID 97 Digest, pp. 841–844, 1997.

Furue, H. et al, "Characteristics and Driving Scheme of Polymer–Stabilized Monostable FLCD Exhibiting Fast Response Time and High Contrast Ratio with Gray–Scale Capability," SID 98 Digest, pp. 782–785, 1998.

English abstract re Japanese patent application No. 7–130652, published May 19, 1995.

* cited by examiner

*Primary Examiner*—Matthew C. Bella
*Assistant Examiner*—Hau Nguyen
(74) *Attorney, Agent, or Firm*—Cook, Alex, McFarron, Manzo, Cummings & Mehler, Ltd.

(57) ABSTRACT

There is provided a driving circuit which is simple and has a small occupied area. A shift register circuit of the present invention includes a plurality of register circuits. Each of the register circuits includes a clocked inverter circuit and an inverter circuit. Both are connected in series with each other so that an output signal of the clocked inverter circuit becomes an input signal of the inverter circuit. Further, the register circuit includes a signal line by which an output signal of the inverter circuit is transmitted. Since a number of elements are connected to the signal line and parasitic capacitance is large, it has a high load. The shift register circuit of the present invention uses the fact that since the parasitic capacitance of the signal line is large, it has a high load.

110 Claims, 19 Drawing Sheets

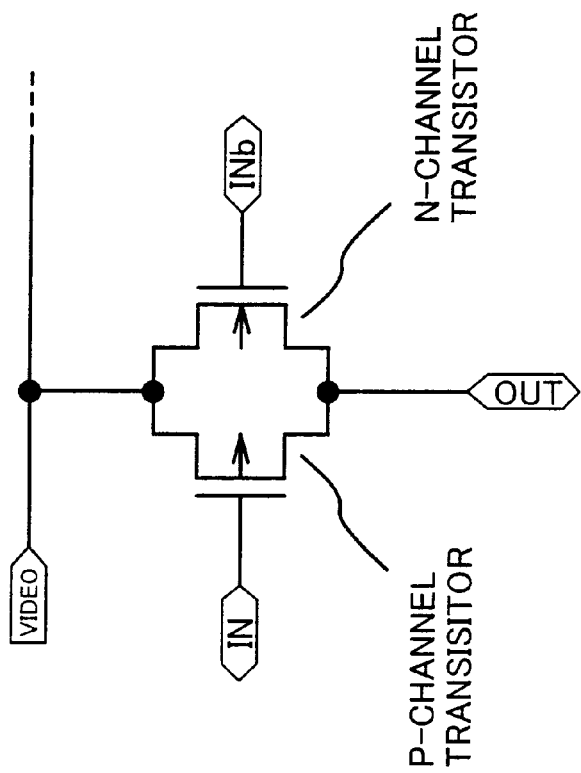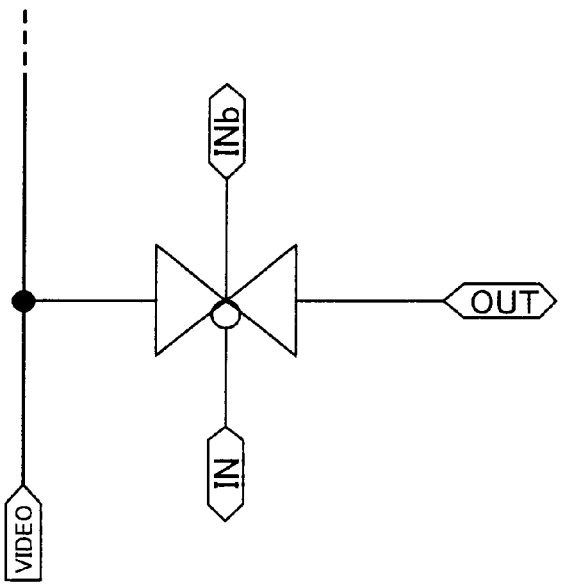
FIG. 3

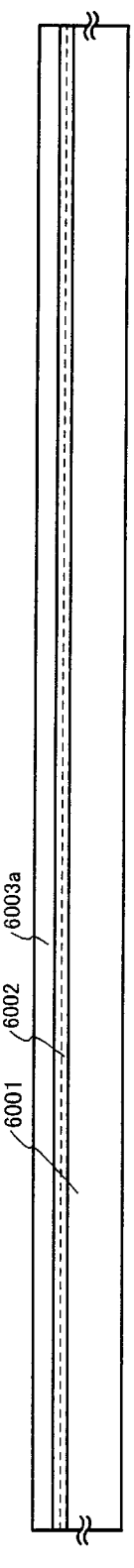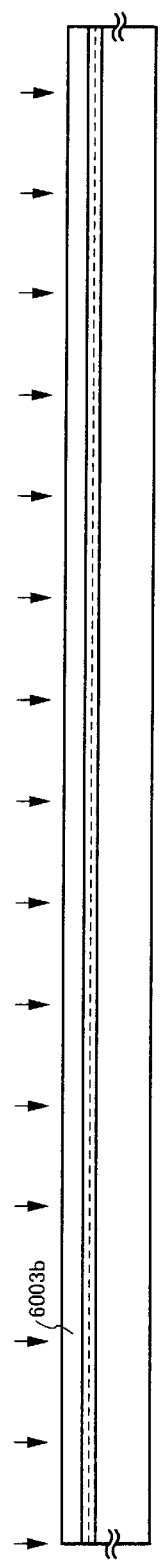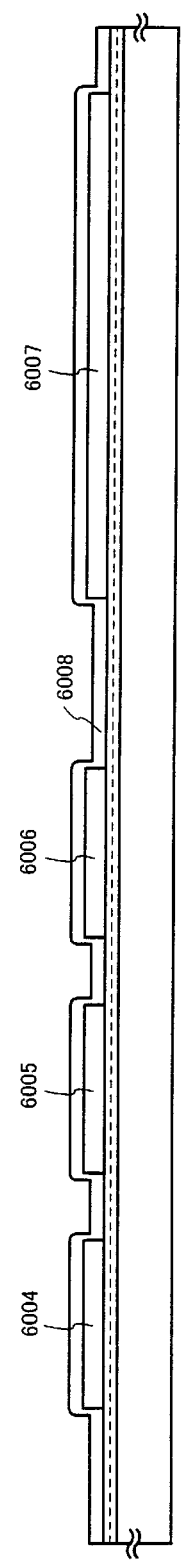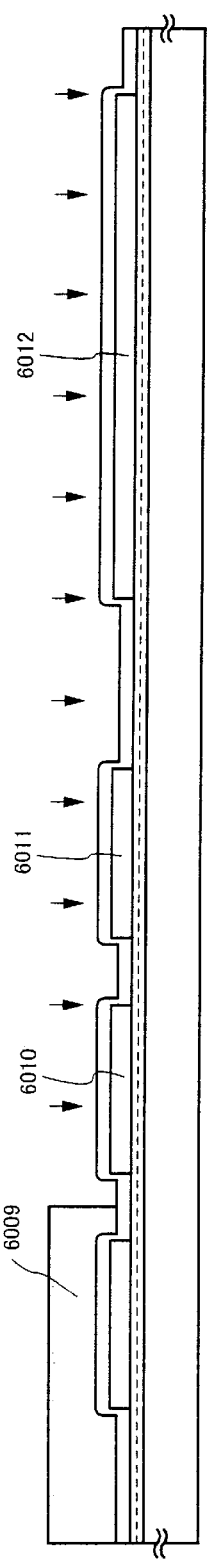

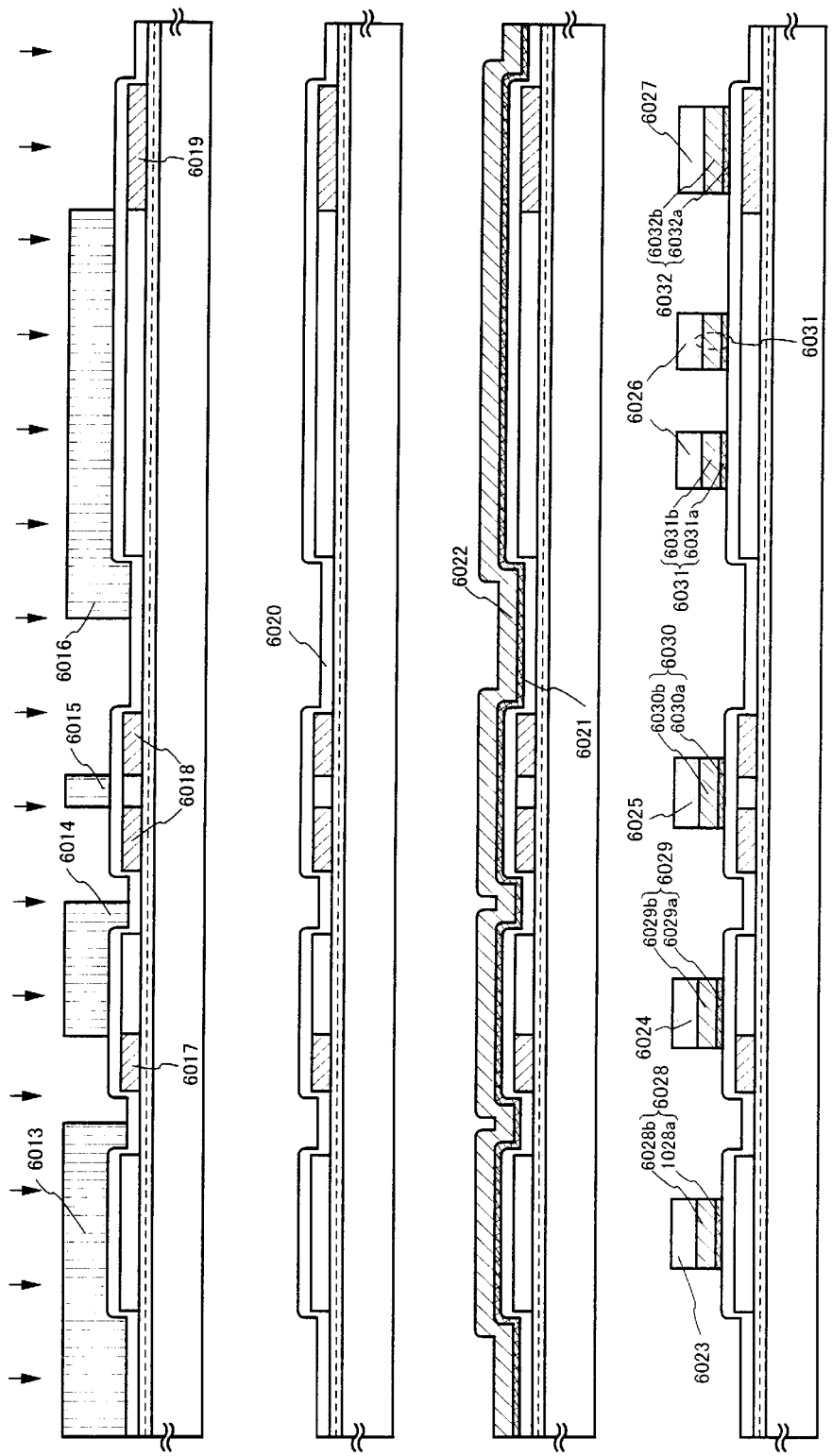

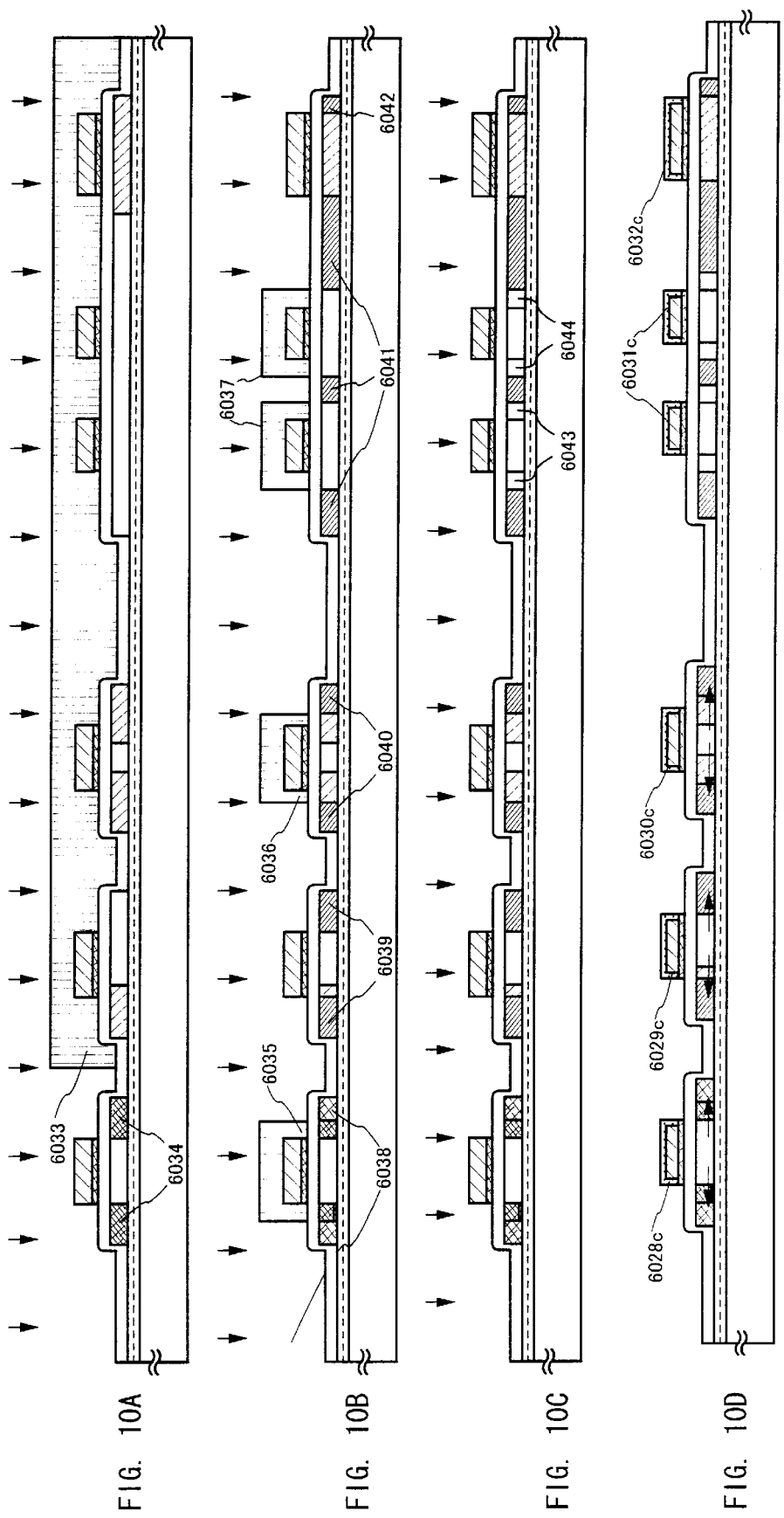

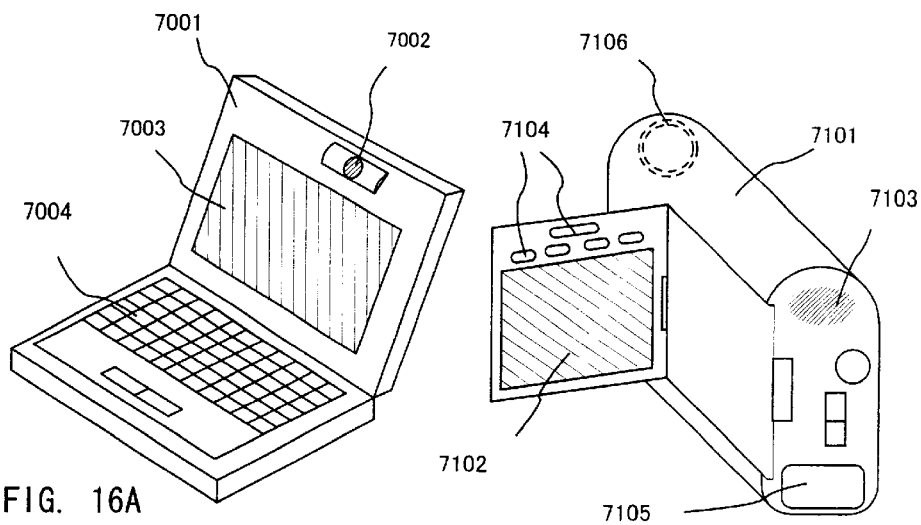
FIG. 16A
FIG. 16B
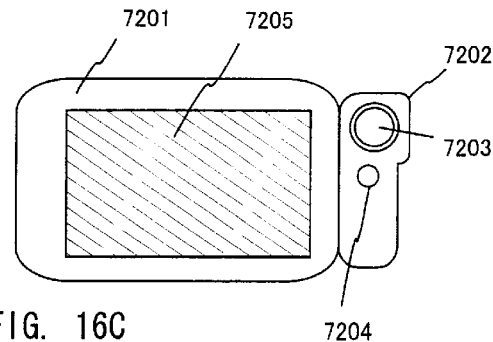
FIG. 16C
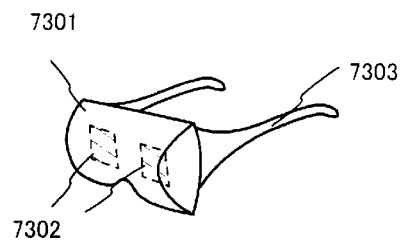
FIG. 16D
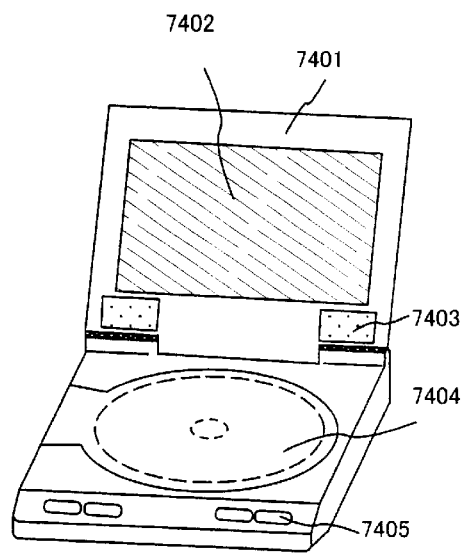
FIG. 16E
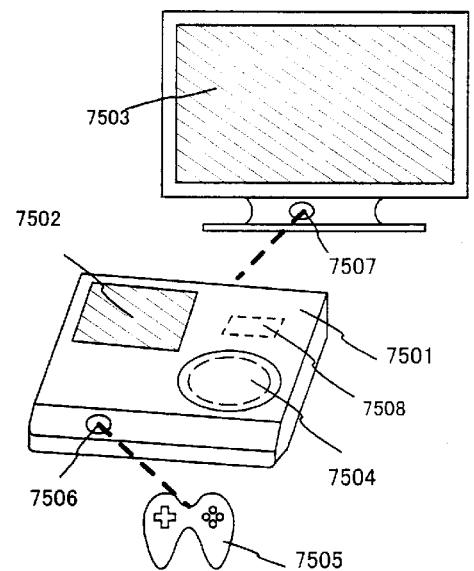
FIG. 16F

SHIFT REGISTER CIRCUIT, DRIVING CIRCUIT OF DISPLAY DEVICE, AND DISPLAY DEVICE USING THE DRIVING CIRCUIT

BACKGROUND OF THE INVENTION

1. Field of the Invention The present invention relates to a driving circuit of a display device. Besides, the present invention relates to a display device using the driving circuit.

2. Description of the Related Art

Techniques of manufacturing a semiconductor device, for example, a thin film transistor (TFT), which has a semiconductor thin film formed on an inexpensive glass substrate, have been making rapid progress in recent years. This is because there is an increasing demand for active matrix liquid crystal display devices (hereafter referred to as liquid crystal display devices).

In the liquid crystal display device, several hundred thousands to several millions of TFTs are arranged in matrix in a pixel portion, and electric charges going into and out of pixel electrodes that are connected to each TFT are controlled by the switching function of the TFTs.

Conventionally, thin film transistors using an amorphous silicon film formed on a glass substrate are arranged in the pixel portion.

Further, in recent years, a technique is known in which quartz is utilized as a substrate and thin film transistors are manufactured using a polycrystalline silicon film. In this case, both a driver circuit and a pixel portion are integrally formed on the quartz substrate.

Still further, recently, a technique in which thin film transistors using a crystalline silicon film are formed on a glass substrate by laser annealing or the like is also known.

Liquid crystal display devices are mainly used in notebook personal computers. Different from analog data used in the current television signals (NTSC or PAL) or the like, the personal computer outputs digital data to a display device. Conventionally, digital data from a personal computer are converted into analog data and then inputted into the liquid crystal display device, or to a liquid crystal display device that utilizes an externally attached digital driver.

Therefore, a liquid crystal display device having a digital interface capable of directly inputting digital data from outside is in the spotlight.

Here, FIG. 17 shows a part of a source driver of a liquid crystal display device including a digital interface to which attention has been paid recently. In FIG. 17, reference numeral 8000 designates a shift register circuit which includes a plurality of register circuits 8010. The register circuit is constituted by four clocked inverter circuits and a NAND circuit. Reference numeral 8100 designates a sampling circuit which includes a plurality of analog switches 8110.

Note that a scan direction switching circuit is included in the shift register circuit 8000 shown in FIG. 17. The scan direction switching circuit is a circuit for controlling the order of the output of the timing pulse from the shift register circuit 8000 from left to right or from right to left in accordance with a scan direction switching signal inputted from outside.

The shift register circuit 8000 generates a timing pulse on the basis of a clock signal (CLK), a clock inversion signal (CLKB), and a start pulse supplied from the outside, and sends the timing pulse to the sampling circuit. The sampling circuit 8100 samples (takes in) analog video data (VIDEO) inputted from the outside on the basis of the timing pulse from the shift register circuit 8000, and outputs to a source signal line.

In the conventional shift register circuit 8000 as shown in FIG. 17, one register circuit 8010 is constituted by four clocked inverter circuits and a NAND circuit, the shift register circuit 8000 is complicated, and the number of elements constituting it is large. Under the present circumstances in which a liquid crystal display device of higher resolution is demanded, with the improvement of the resolution, the area of the shift register circuit becomes large, and the number of elements constituting the shift register circuit is also increased.

Because of this increase in the number of elements, the production yield in the entire liquid crystal display device may become worse. Further, if the possessed surface area of the circuits becomes larger, it hinders the making of small scale liquid crystal display devices.

SUMMARY OF THE INVENTION

Accordingly, the present invention has been made in view of the above problems, and an object of the present invention is therefore to attain improvement in production yield and compactness of the liquid crystal display device by providing a driver circuit that is simple as well as possessing a small area of the substrate.

Reference will be made to FIG. 1. FIG. 1 shows a shift register circuit 100 of the present invention. The shift register circuit of the present invention includes a plurality of register circuits (a first register circuit 110, a second register circuit 120, a third register circuit 130, a fourth register circuit 140, and a fifth register circuit 150). For convenience of explanation, FIG. 1 shows the five-stage shift register circuit 100 including the first to fifth register circuits. However, the shift register circuit of the present invention can be made an n-stage shift register circuit including first to n-th (n) register circuits (n is a natural number).

A description will be made on the first register circuit 110 as an example. The first register circuit 110 includes a clocked inverter circuit 111 and an inverter circuit 112. Both are connected in series with each other so that an output signal of the clocked inverter circuit 111 becomes an input signal of the inverter circuit 112. Further, the first register circuit 110 includes a signal line 113 by which an output signal of the inverter circuit 112 is transmitted, and parasitic capacitance generated by this signal line 113 and a power source line or a ground line may be considered as an element constituting the register circuit.

Since the signal line 113 is connected to many elements, e.g. an analog switch, a signal line of the pixel portion, an adjacent register circuit, etc., and parasitic capacitance is large, it has a high load. The shift register circuit of the present invention uses the fact that the parasitic capacitance of the signal line 113 is large so that it has a high load.

Note that the second register circuit 120, the third register circuit 130, the fourth register circuit 140, and the fifth register circuit 150 have also the same structure as the first register circuit 110. That is, the second register circuit 120 includes a clocked inverter circuit 121, an inverter circuit 122, and a signal line 123. The third register circuit 130 includes a clocked inverter circuit 131, an inverter circuit 132, and a signal line 133. The fourth register circuit 140 includes a clocked inverter circuit 141, an inverter circuit 142, and a signal line 143. The fifth register circuit 150 includes a clocked inverter circuit 151, an inverter circuit 152, and a signal line 153.

Besides, a clock signal (CLK), a clock back signal (CLKB) with a reverse phase to the clock signal, and a start pulse (SP) are inputted to the shift register circuit 100 from the outside. These signals are inputted to all register circuits (the first register circuit 110, the second register circuit 120, the third register circuit 130, the fourth register circuit 140, and the fifth register circuit 150) constituting the shift register circuit of the present invention.

Here, the operation of the shift register circuit of the present invention will be described.

The clocked inverter circuit 111 of the first register circuit 110 operates in synchronization with the inputted clock signal (CLK) and the clock back signal (CLKB), inverts the logic of the inputted start pulse (SP), and outputs to the inverter circuit 112. The inverter circuit 112 inverts the logic of the inputted pulse, and outputs to the signal line 113 and the next stage second register circuit 120.

A pulse outputted from the former stage first register circuit 110 is inputted to the clocked inverter circuit 121 of the second register circuit 120. The clocked inverter circuit 121 operates in synchronization with the inputted clock signal (CLK) and the clock back signal (CLKB), inverts the logic of the inputted pulse, and outputs to the inverter circuit 122. The inverter circuit 122 inverts the logic of the inputted pulse and outputs to the signal line 123 and the next stage third register circuit 130.

All the register circuits operate in the same way. Thus, timing pulses are sequentially outputted at regular intervals from the first register circuit 110, the second register circuit 120, the third register circuit 130, the fourth register circuit 140, and the fifth register circuit 150.

By adopting the foregoing structure, the shift register circuit of the present invention is simplified as compared with a conventional circuit, and the number of elements can be lessened.

Next, reference will be made to FIG. 18. In FIG. 18, the shift register circuit of the present invention is provided with a first NAND circuit 114, a second NAND circuit 124, a third NAND circuit 134, and a fourth NAND circuit 144. Note that a circuit including the plurality of register circuits 110, 120, 130, 140, and 150, and the plurality of NANDs 114, 124, 134 and 144 may be made a register circuit of the present invention.

The timing pulses outputted from the first register circuit 110 and the second register circuit 120 are inputted to the first NAND circuit 114. The first NAND circuit 114 outputs NAND logic of the timing pulses from the first register circuit 110 and the second register circuit 120.

The timing pulses outputted from the second register circuit 120 and the third register circuit 130 are inputted to the second NAND circuit 124. The second NAND circuit 124 outputs NAND logic of the timing pulses from the second register circuit 120 and the third register circuit 130.

The timing pulses outputted from the third register circuit 130 and the fourth register circuit 140 are inputted to the third NAND circuit 134. The third NAND circuit 134 outputs NAND logic of the timing pulses from the third register circuit 130 and the fourth register circuit 140.

The timing pulses outputted from the fourth register circuit 140 and the fifth register circuit 150 are inputted to the fourth NAND circuit 144. The fourth NAND circuit 144 outputs NAND logic of the timing pulses from the fourth register circuit 140 and the fifth register circuit 150.

Like this, in the shift register circuit of the present invention shown in FIG. 18, timing pulses are sequentially outputted at regular intervals from the first NAND circuit 114, the second NAND circuit 124, the third NAND circuit 134, and the fourth NAND circuit 144.

Here, the structure of the present invention will be set forth below.

According to one of aspects of the present invention, there is provided a shift register circuit comprising a plurality of register circuits, each register circuit including a clocked inverter circuit and an inverter circuit connected in series with each other, and a signal line, characterized in that the clocked inverter circuit and the inverter circuit of one of the register circuits generate a timing pulse on the basis of a clock signal, a clock back signal, and a start pulse inputted externally, and output the timing pulse to the register circuit adjacent to the one of the register circuits and the signal line of the one of the register circuits.

According to another aspect of the present invention, there is provided a shift register circuit comprising first, second, . . . , (n−1)th, and n-th register circuits (n is a natural number), each register circuit including a clocked inverter circuit and an inverter circuit connected in series with each other, and a signal line, wherein a timing pulse outputted from the signal line of the (n−1)th register circuit is inputted to the n-th register circuit.

According to another aspect of the present invention, there is provided a shift register circuit comprising first, second, . . . , (n−1)th, and n-th register circuits (n is a natural number), each register circuit including a clocked inverter circuit and an inverter circuit connected in series with each other, wherein the clocked inverter circuit and the inverter circuit of each register circuit generate a timing pulse on the basis of a clock signal, a clock back signal, and a start pulse inputted externally, and the (n−1)th register circuit outputs the timing pulse to the n-th register circuit and the signal line of the (n−1)th register circuit.

According to another aspect of the present invention, there is provided a driving circuit of a display device, comprising: a shift register circuit including a plurality of register circuits, each register circuit including a clocked inverter circuit and an inverter circuit connected in series with each other; and a sampling circuit including a plurality of analog switches, wherein the clocked inverter circuit and the inverter circuit of one of the register circuits generate a timing pulse on the basis of a clock signal, a clock back signal, and a start pulse inputted externally, and output the timing pulse to one of the analog switches and the register circuit adjacent to the one of the register circuits.

According to another aspect of the present invention, there is provided a driving circuit of a display device, comprising: a shift register circuit including first, second, . . . , (n−1)th, and n-th register circuits (n is a natural number), each register circuit including a clocked inverter circuit and an inverter circuit connected in series with each other; and a sampling circuit including first, second, . . . , (n−1)th, and n-th analog switches, wherein a timing pulse outputted from the (n−1)th register circuit is inputted to the (n−1)th analog switch and the n-th register circuit, and the analog switch samples externally inputted video data on the basis of the inputted timing pulse.

According to another aspect of the present invention, there is provided a driving circuit of a display device, comprising: a shift register circuit including first, second, . . . , (n−1)th, and n-th register circuits (n is a natural number), each register circuit including a clocked inverter circuit and an inverter circuit connected in series with each other; and a sampling circuit including first, second, , (n-t)th, and n-th analog switches, wherein the clocked inverter circuit and the inverter circuit of each register circuit generate a timing pulse on the basis of a clock signal, a clock back signal, and a start pulse externally inputted, the (n-1)th register circuit outputs the timing pulse to the (n-1)th analog switch and the n-th register circuit, and the analog switch samples externally inputted video data on the basis of the inputted timing pulse.

According to another aspect of the present invention, there is provided a driving circuit of a display device, comprising: a shift register circuit including first, second, ..., (n-1)th, and n-th register circuits (n is a natural number), each register circuit including a clocked inverter circuit and an inverter circuit connected in series with each other; and a scan direction switching circuit including first, second, ..., (n-1)th, and n-th switching circuits, each switching circuit including two analog switches, wherein a timing pulse outputted from the (n-1)th register circuit is inputted to the (n-1)th switching circuit, and the (n-1)th switching circuit outputs the timing pulse to the (n-2)th or n-th register circuit on the basis of an externally inputted scan direction switching signal.

According to another aspect of the present invention, there is provided a driving circuit of a display device, comprising: a shift register circuit including first, second, ..., (n-1)th, and n-th register circuits (n is a natural number), each register circuit including a clocked inverter circuit and an inverter circuit connected in series with each other; and a scan direction switching circuit including first, second, ..., (n-1)th, and n-th switching circuits, each switching circuit including two analog switches, wherein the clocked inverter circuit and the inverter circuit of each register circuit generate a timing pulse on the basis of a clock signal, a clock back signal, and a start pulse externally inputted, the timing pulse outputted from the (n-1)th register circuit is inputted to the (n-1)th switching circuit, and the (n-1)th switching circuit outputs the timing pulse to the (n-2)th or n-th register circuit on the basis of an externally inputted scan direction switching signal.

According to another aspect of the present invention, there is provided a driving circuit of a display device, comprising: a shift register circuit including first, second, ..., (n-1)th, and n-th register circuits (n is a natural number), each register circuit including a clocked inverter circuit and an inverter circuit connected in series with each other; a scan direction switching circuit including first, second, ..., (n-1)th, and n-th switching circuits, each switching circuit including two analog switches; and a sampling circuit including first, second, ..., (n-1)th, and n-th analog switches, wherein a timing pulse outputted from the (n-1)th register circuit is inputted to the (n-1)th switching circuit, the (n-1)th switching circuit outputs, on the basis of an externally inputted scan direction switching signal, the timing pulse to the (n-2)th or n-th register circuit and the (n-1)th analog switch, and the analog switch samples externally inputted video data on the basis of the inputted timing pulse.

According to another aspect of the present invention, there is provided a driving circuit of a display device, comprising: a shift register circuit including first, second, ..., (n-1)th, and n-th register circuits (n is a natural number), each register circuit including a clocked inverter circuit and an inverter circuit connected in series with each other; a scan direction switching circuit including first, second, ..., (n-1)th, and n-th switching circuits, each switching circuit including two analog switches; and a sampling circuit including first, second, ..., (n-1)th, and n-th analog switches, wherein the clocked inverter circuit and the inverter circuit of each register circuit generate a timing pulse on the basis of a clock signal, a clock back signal, and a start pulse externally inputted, the timing pulse outputted from the (n-1)th register circuit is inputted to the (n-1)th switching circuit, the (n-1)th switching circuit outputs, on the basis of an externally inputted scan direction switching signal, the timing pulse to the (n-2)th or n-th register circuit and the (n-1)th analog switch, and the analog switch samples externally inputted video data on the basis of the inputted timing pulse.

BRIEF DESCRIPTION OF THE DRAWINGS

In the accompanying drawings:

FIG. 3 is a circuit structural view of an analog switch of a driving circuit including a shift register circuit of the present invention;

FIGS. 8A to 8D are views showing a manufacturing process of a liquid crystal display device using a driving circuit of the present invention;

FIGS. 9A to 9D are views showing the manufacturing process of the liquid crystal display device using the driving circuit of the present invention;

FIGS. 10A to 10D are views showing the manufacturing process of the liquid crystal display device using the driving circuit of the present invention;

FIGS. 16A to 16F show examples of electronic instruments each incorporating a liquid crystal display device using a driving circuit of the present invention;

DETAILED DESCRIPTION OF THE PREFERRED EMBODIMENTS

Here, a mode of carrying out the present invention will be described.

Figure 1:
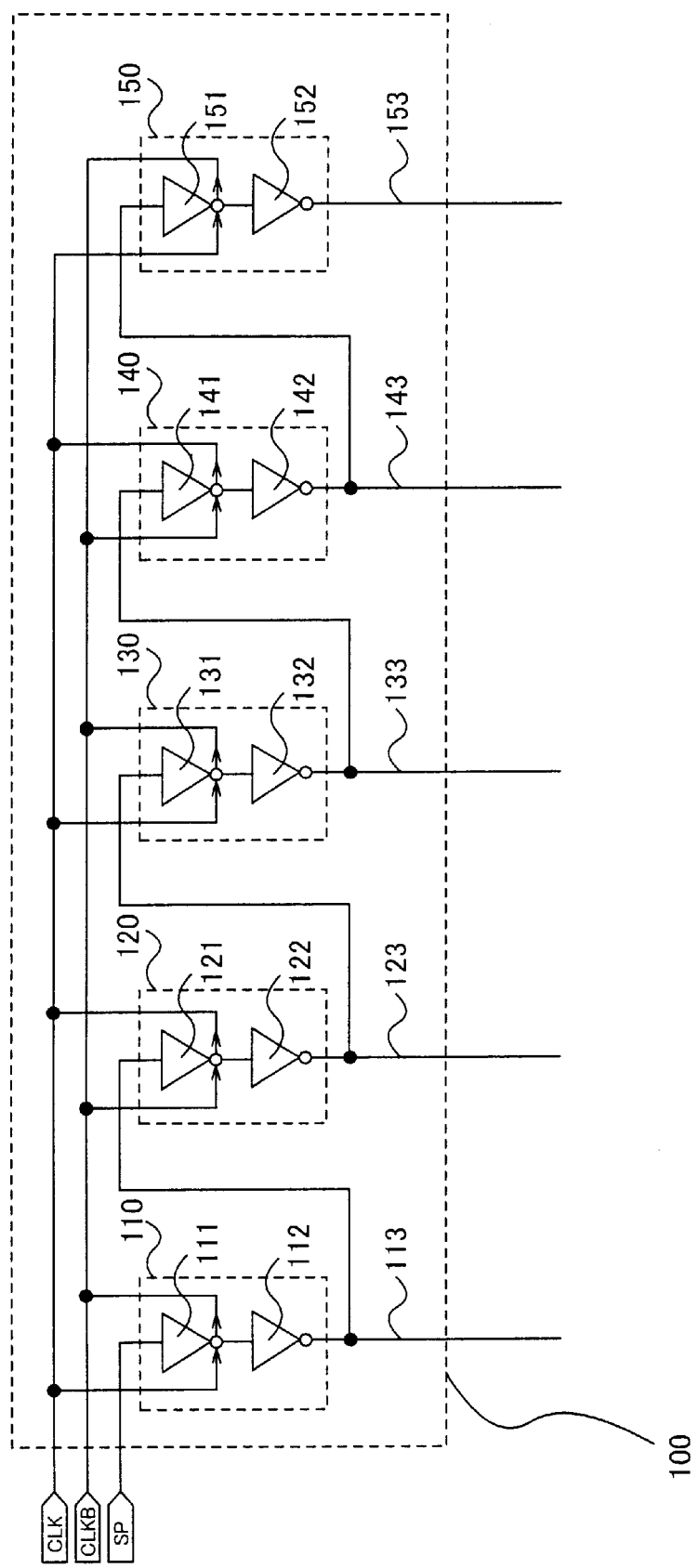
FIG. 1 is a circuit structural view of a shift register circuit of the present invention.
Figure 2:
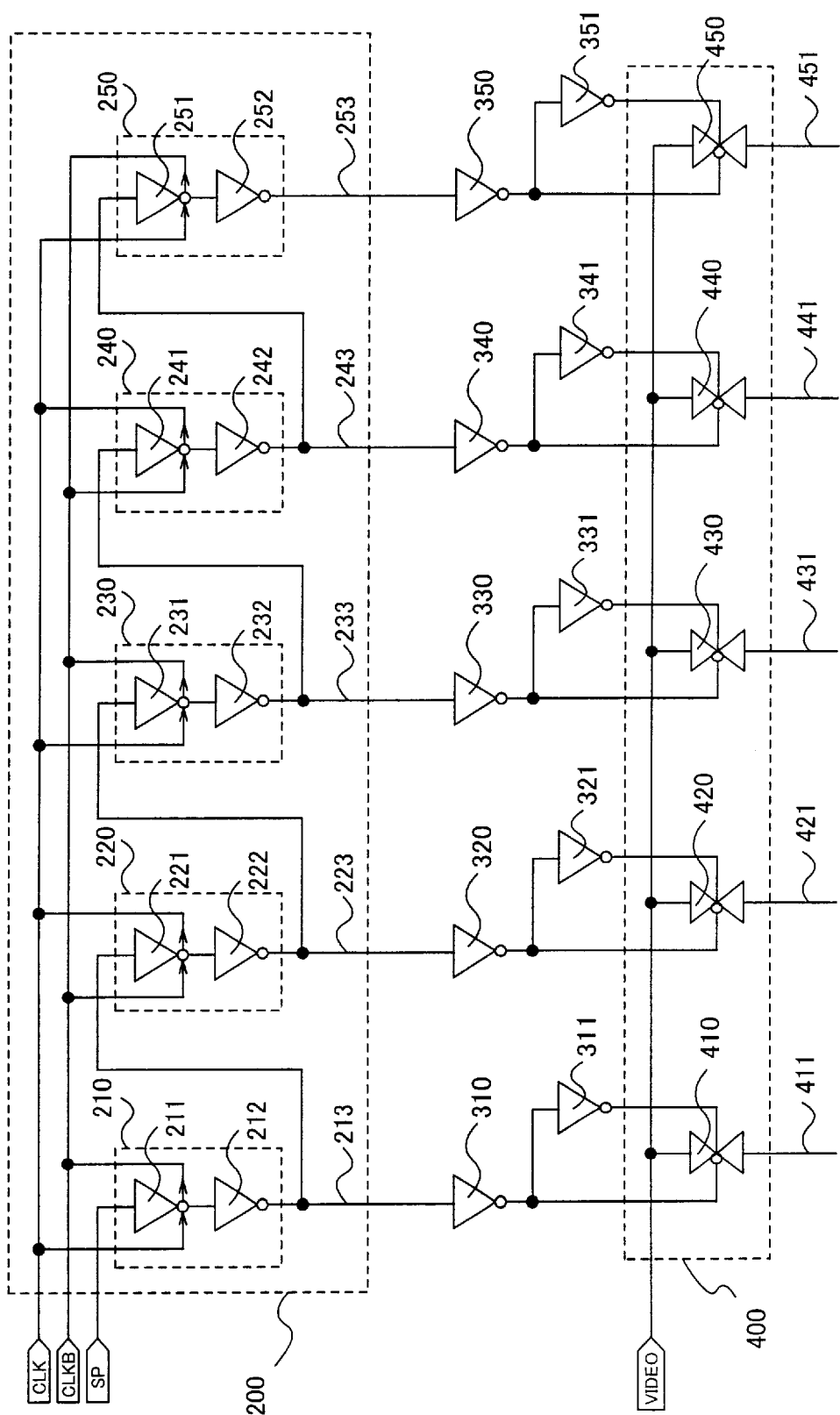
FIG. 2 is a circuit structural view of a driving circuit including a shift register circuit of the present invention.

Reference will be made to FIG. 2. FIG. 2 shows a mode of a shift register circuit of the present invention. FIG. 2 shows a shift register circuit 200 of the present invention, inverter circuits 310 and 311, and a sampling circuit 400, and a driving circuit (source driver) of a display device is constructed on the whole.

The shift register circuit of the present invention shown in FIG. 2 includes a plurality of register circuit (a first register circuit 210, a second register circuit 220, a third register circuit 230, a fourth register circuit 240, and a fifth register circuit 250). For convenience of explanation, FIG. 2 shows the five-stage shift register circuit 200 including the first to fifth (five) register circuits. However, as described above, the shift register circuit of the present invention can be made an n-stage shift register circuit including first to n-th (n) register circuits (n is a natural number).

A description will be made on the first register circuit as an example. The first register circuit 210 includes a clocked inverter circuit 211 and an inverter circuit 212. Both are connected in series with each other so that an output signal of the clocked inverter circuit 211 becomes an input signal of the inverter circuit 212. Further, the first register circuit 210 includes a signal line 213 by which an output signal of the inverter circuit 212 is transmitted, and parasitic capacitance of this signal line 213 may also be considered as an element constituting the register circuit.

Note that the second register circuit 220, the third register circuit 230, the fourth register circuit 240, and the fifth register circuit 250 have also the same structure as the first register circuit 210. That is, the second register circuit 220 includes a clocked inverter circuit 221, an inverter circuit 222, and a signal line 223. The third register circuit 230 includes a clocked inverter circuit 231, an inverter circuit 232, and a signal line 233. The fourth register circuit 240 includes a clocked inverter circuit 241, an inverter circuit 242, and a signal line 243. The fifth register circuit 250 includes a clocked inverter circuit 251, an inverter circuit 252, and a signal line 253.

Reference numerals 310 and 311, 320 and 321, 330 and 331, 340 and 341, and 350 and 351 designate inverter circuits.

Reference numeral 400 designates the sampling circuit, which samples (takes in) analog video data inputted from the outside and outputs to a source signal line. The sampling circuit includes a plurality of analog switches (a first analog switch 410, a second analog switch 420, a third analog switch 430, a fourth analog switch 440, and a fifth analog switch 450).

The first analog switch 410, the second analog switch 420, the third analog switch 430, the fourth analog switch 440, and the fifth analog switch 450 are connected so that timing pulses from the first register circuit 210, the second register circuit 220, the third register circuit 230, the fourth register circuit 240, and the fifth register circuit 250 are inputted through inverter circuits, respectively.

FIG. 3 shows a circuit structure of the first analog switch 410, the second analog switch 420, the third analog switch 430, the fourth analog switch 440, and the fifth analog switch 450 used in this mode. In this mode, the first analog switch 410, the second analog switch 420, the third analog switch 430, the fourth analog switch 440, and the fifth analog switch 450 are respectively constituted by one p-channel transistor and one n-channel transistor. Note that the first analog switch 410, the second analog switch 420, the third analog switch 430, the fourth analog switch 440, and the fifth analog switch 450 may have a circuit structure other than that shown in this mode.

A clock signal (CLK), a clock back signal (CLKB) with a reverse phase to the is clock signal, and a start pulse (SP) are inputted to the shift register circuit 200 from the outside. These signals are inputted to all the register circuits 210, 220, 230, 240 and 250 constituting the shift register circuit of the present invention.

The register circuit 210 and the inverter circuit 310 are connected so that an output signal of the register circuit 210 becomes an input signal of the inverter circuit 310. Besides, connection is made so that output signals of the inverter circuits 310 and 311 become input signals of the analog switch 410.

Analog video data (VIDEO) is inputted from the outside to the first analog switch 410, the second analog switch 420, the third analog switch 430, the fourth analog switch 440, and the fifth analog switch 450 of the sampling circuit 400.

Timing signals sequentially outputted from the first register circuit 210, the second register circuit 220, the third register circuit 230, the fourth register circuit 240, and the fifth register circuit 250 of the shift register circuit 200 are inputted to the first analog switch 410, the second analog switch 420, the third analog switch 430, the fourth analog switch 440, and the fifth analog switch 450 of the sampling circuit through the inverter circuits 310 and 311, 320 and 321, 330 and 331, 340 and 341, and 350 and 351, respectively. The first analog switch 410, the second analog switch 420, the third analog switch 430, the fourth analog switch 440, and the fifth analog switch 450 of the sampling circuit sample the analog video data in synchronization with the inputted timing pulses, respectively, and supply it to source signal lines 411, 421, 431, 441, and 451.

Figure 19:
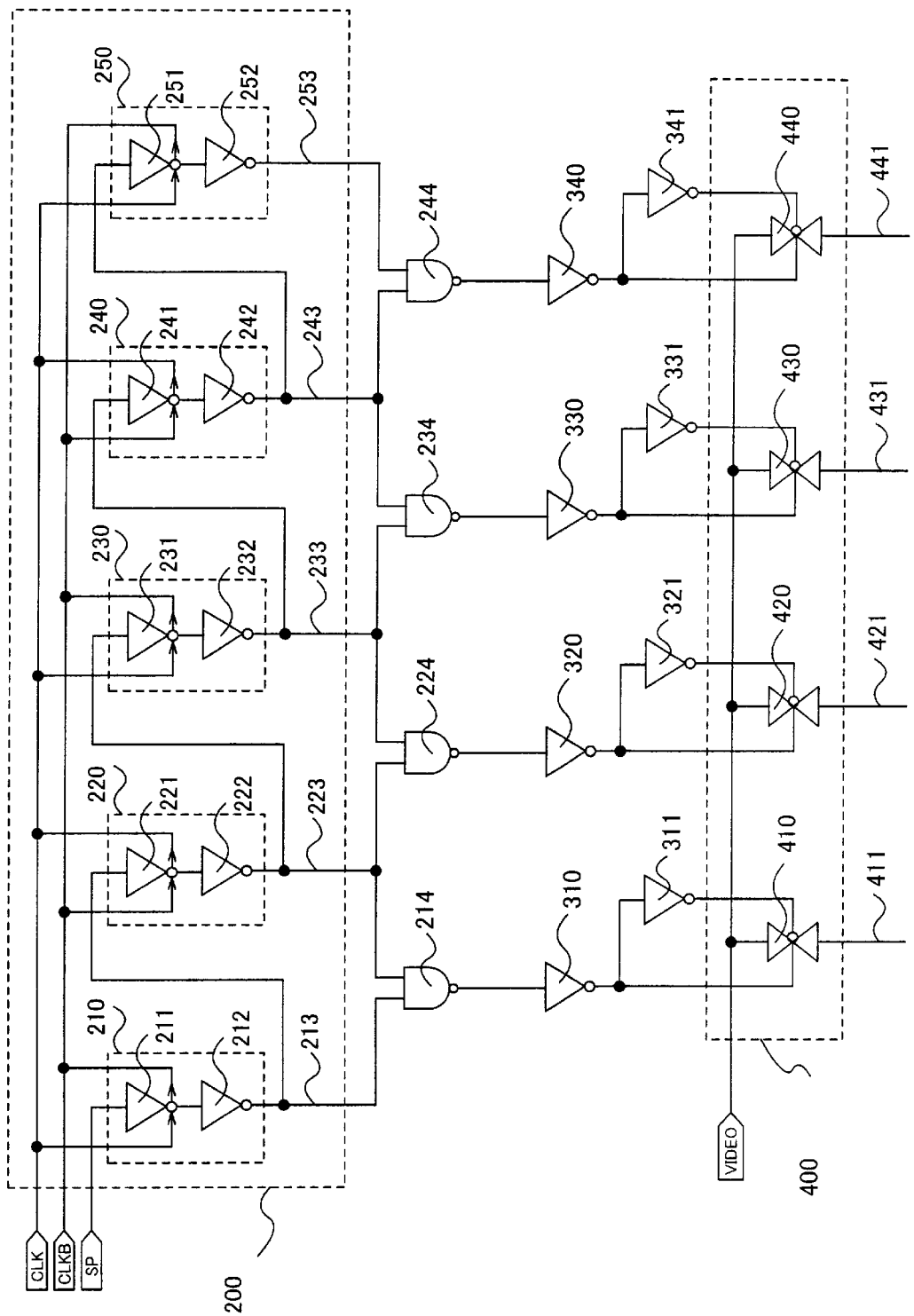
FIG. 19 is a circuit structural view of a driving circuit including a shift register circuit of the present invention.

Next, reference will be made to FIG. 19. In FIG. 19, the shift register circuit of this mode is provided with a first NAND circuit 214, a second NAND circuit 224, a third NAND circuit 234, and a fourth NAND circuit 244. Note that a circuit including the plurality of register circuits 210, 220, 230, 240, and 250 and the plurality of NANDs 214, 224, 234, and 244 may be made a shift register circuit of the present invention.

The timing pulses outputted from the first register circuit 210 and the second register circuit 220 are inputted to the first NAND circuit 214. The first NAND circuit 214 outputs NAND logic of the timing pulses from the first register circuit 210 and the second register circuit 220.

The timing pulses outputted from the second register circuit 220 and the third register circuit 230 are inputted to the second NAND circuit 224. The second NAND circuit 224 outputs NAND logic of the timing pulses from the second register circuit 220 and the third register circuit 230.

The timing pulses outputted from the third register circuit 230 and the fourth register circuit 240 are inputted to the third NAND circuit 234. The third NAND circuit 234 outputs NAND logic of the timing pulses from the third register circuit 230 and the fourth register circuit 240.

The timing pulses outputted from the fourth register circuit 240 and the fifth register circuit 250 are inputted to the fourth NAND circuit 244. The fourth NAND circuit 244 outputs NAND logic of the timing pulses from the fourth register circuit 240 and the fifth register circuit 250.

Like this, in the shift register circuit of this mode shown in FIG. 19, timing pulses are sequentially outputted at regular intervals from the first NAND circuit 214, the second NAND circuit 224, the third NAND circuit 234, and the fourth NAND circuit 244. The operation of the sampling circuit 400 is as described above.

Figure 4:
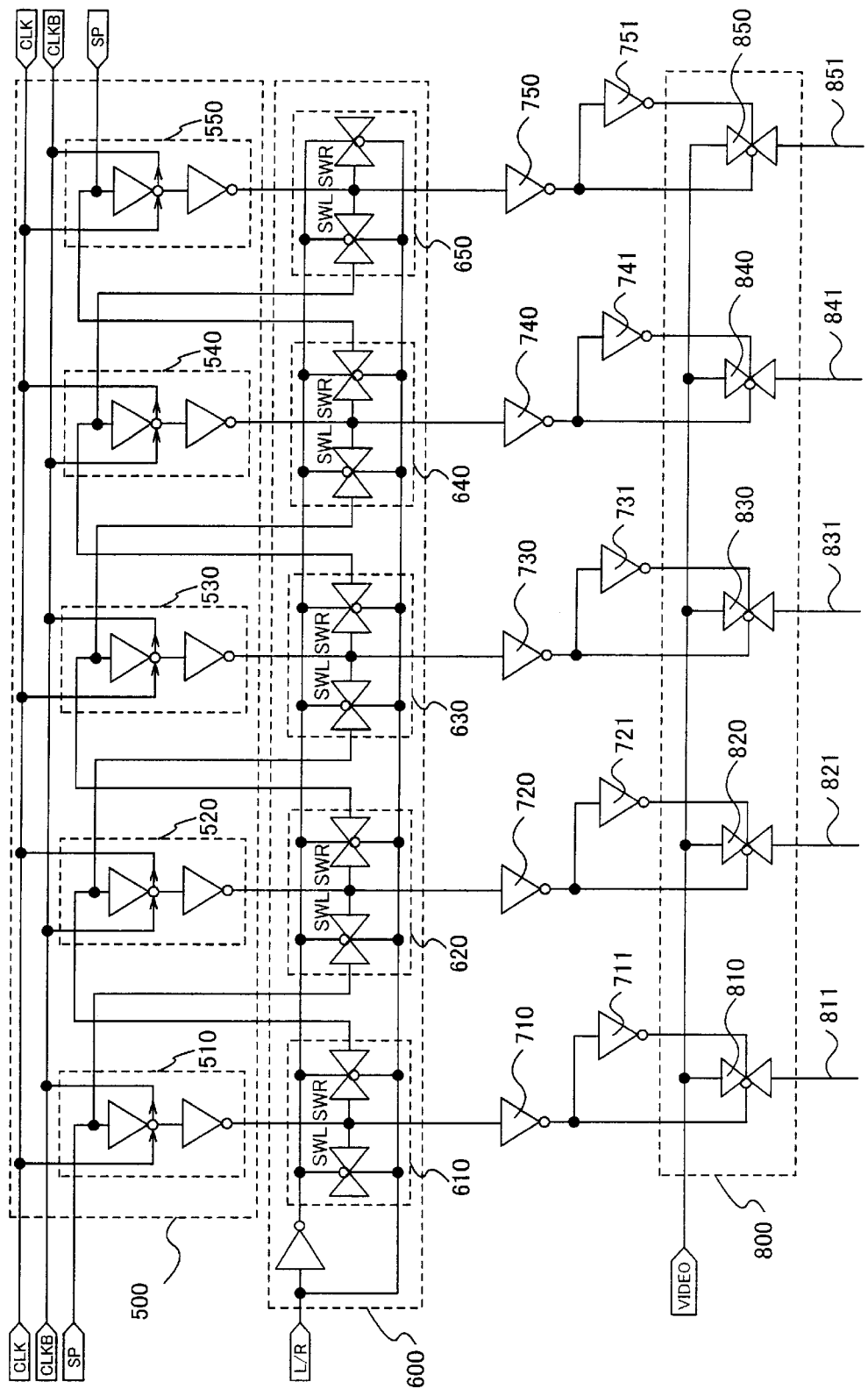
FIG. 4 is a circuit structural view of a driving circuit including a shift register circuit of the present invention.

Next, reference will be made to FIG. 4. FIG. 4 shows, in addition to the structure of FIG. 2, a scan direction switching circuit 600.

The shift register circuit 500 includes a plurality of register circuits (a first register circuit 510, a second register circuit 520, a third register circuit 530, a fourth register circuit 540, and a fifth register circuit 550). The scan direction switching circuit 600 includes a plurality of switching circuits (a first switching circuit 610, a second switching circuit 620, a third switching circuit 630, a fourth switching circuit 640, and a fifth switching circuit 650). The first switching circuit 610, the second switching circuit 620, the third switching circuit 630, the fourth switching circuit 640, and the fifth switching circuit 650 respectively includes two analog switches SWL and SWR. The first switching circuit 610, the second switching circuit 620, the third switching circuit 630, the fourth switching circuit 640, and the fifth switching circuit 650 are circuits respectively for controlling the timing pulse outputted from the register circuit to determine to which of right and left register circuits the timing pulse is outputted, in accordance with a scan direction switching signal (L/R) inputted from the outside.

With respect to inverter circuits 710 and 711, 720 and 721, 730 and 731, 740 and 741, and 750 and 751, and a sampling circuit 800, please refer to the foregoing example shown in FIG. 2.

In the embodiment mode shown in FIG. 2, in the case where "0 (Lo)" is inputted to the scan direction switching signal (L/R), the start pulse is inputted to the first register circuit. When "0 (Lo)" is inputted to the scan direction switching signal. the analog switch SWR operates, and the timing pulse outputted from the first register circuit 510 is inputted to the right adjacent next stage second resister circuit 520 and the inverter circuit 710. Further, the timing pulse outputted from the second register circuit 520 is inputted to the right adjacent next stage third register circuit 530 and the inverter circuit 720. Further, the timing pulse outputted from the third register circuit 530 is inputted to the right adjacent next stage fourth register circuit 540 and the inverter circuit 730. Further, the timing pulse outputted from the fourth register circuit 540 is inputted to the right adjacent next stage fifth register circuit 550 and the inverter circuit 740. Further, the timing pulse outputted from the fifth register circuit 550 is inputted to the inverter circuit 750.

Like this, in the case where "0 (Lo)" is inputted to the scan direction switching signal (L/R), the generated timing pulses are sequentially outputted to the right adjacent register circuit at regular intervals.

The timing pulse outputted from the first register circuit 510 is inputted to an analog switch 810 of the sampling circuit 800 through the inverter circuits 710 and 711. On the basis of the inputted timing pulse, the analog switch 810 samples (takes in) the video data inputted from the outside, and outputs to a source signal line 811.

Similarly, the timing pulse outputted from the second register circuit 520 is inputted to an analog switch 820 of the sampling circuit 800 through the inverter circuits 720 and 721. On the basis of the inputted timing pulse, the analog switch 820 samples (takes in) the video data inputted from the outside, and outputs to a source signal line 821.

The timing pulses outputted from the third register circuit 530, the fourth register circuit 540, and the fifth register circuit 550 are also inputted to analog switches 830, 840 and 850, respectively. On the basis of the inputted timing pulses. the analog switches 830, 840 and 850 respectively sample (take in) the video data inputted from the outside, and respectively output to source signal lines 831, 841 and 851.

Besides, in the case where "1 (Hi)" is inputted to the scan direction switching signal (L/R), the start pulse (SP) is inputted to the fifth register circuit. When "1 (Hi)" is inputted to the scan direction switching signal, the analog switch SWL operates, and the timing pulse outputted from the fifth register circuit 550 is inputted to the left adjacent next stage fourth register circuit 540 and the inverter circuit 750. Further, the timing pulse outputted from the fourth register circuit 540 is inputted to the left adjacent next stage third register circuit 530 and the inverter circuit 740. Further, the timing pulse outputted from the third register circuit 530 is inputted to the left adjacent next stage second register circuit 520 and the inverter circuit 730. Further, the timing pulse outputted from the second register circuit 520 is inputted to the left adjacent next stage first register circuit 510 and the inverter circuit 720. Further, the timing pulse outputted from the first register circuit 510 is inputted to the inverter circuit 710.

Like this, in the case where "1 (Hi)" is inputted to the scan direction switching signal (L/R), the generated timing signals are sequentially outputted to the left adjacent register circuit at regular intervals.

Note that the operation of the analog switches 810 to 850 of the sampling circuit 800 is as described above.

Here, embodiments of the shift register circuit of the present invention will be described.

Embodiments

[Embodiment 1]

Figure 5:
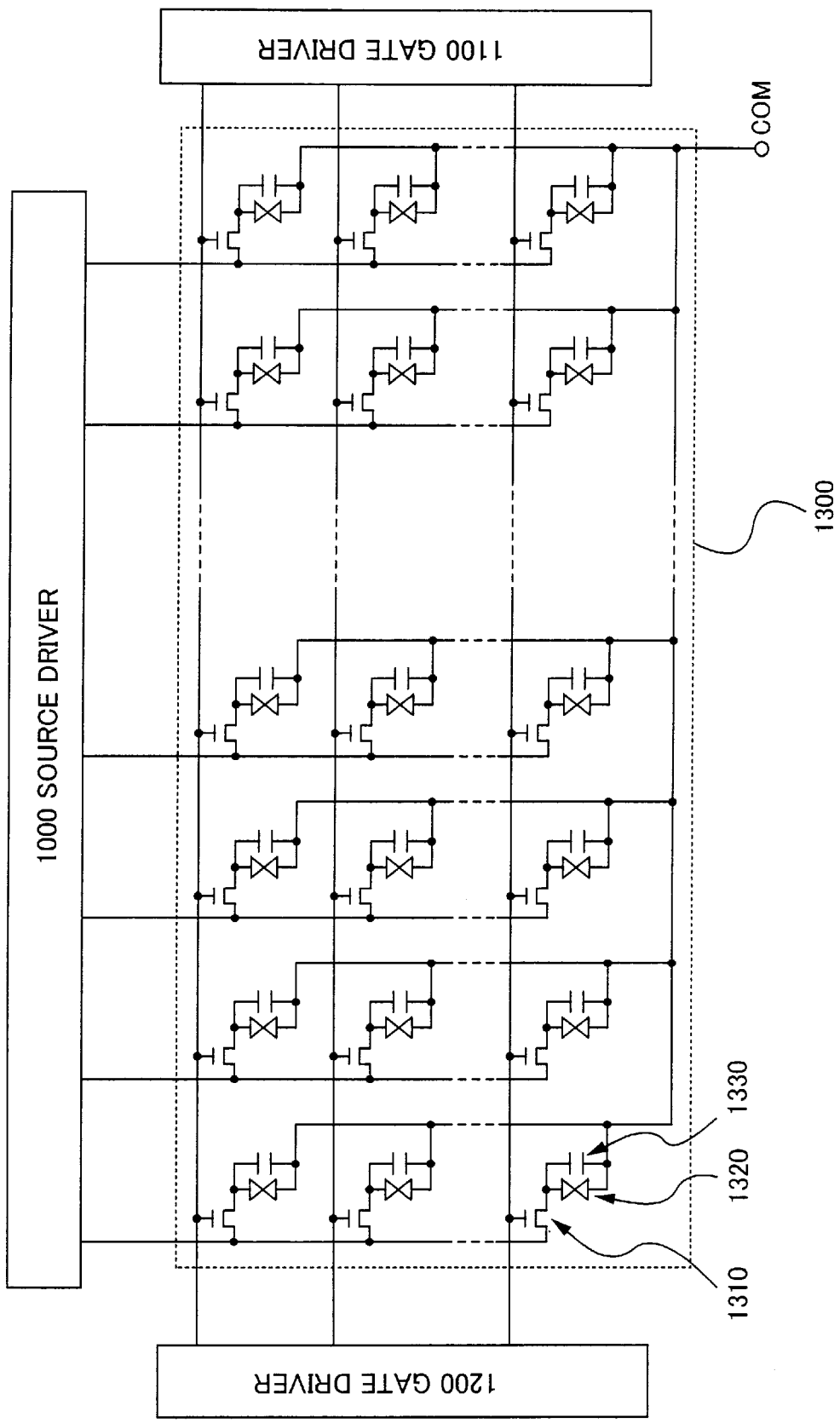
FIG. 5 is a circuit structural view of a liquid crystal display device of embodiment 1.

Reference will be made to FIG. 5. FIG. 5 shows an example of a liquid crystal display device including a source driver and a gate driver, each using a shift register circuit of the present invention.

Reference numeral 1000 designates a source driver using a shift register circuit of the present invention. Reference numerals 1100 and 1200 designate gate drivers. each using a shift register circuit of the present invention. Reference numeral 1300 designates a pixel portion in which pixels, each including a pixel TFT 1310, a pixel electrode (not shown) and a storage capacitance 1330, are arranged in matrix form. Reference numeral 1320 designates a liquid crystal which is held between an active matrix substrate on which the source driver 1000, the gate drivers 1100 and 1200, and circuits constituting the pixel portion and an opposite substrate on which an opposite electrode is formed. The opposite electrode is connected to a common electrode (COM).

In this embodiment, the pixel portion includes 1280×1024 (horizontal×vertical) pixels.

Figure 6:
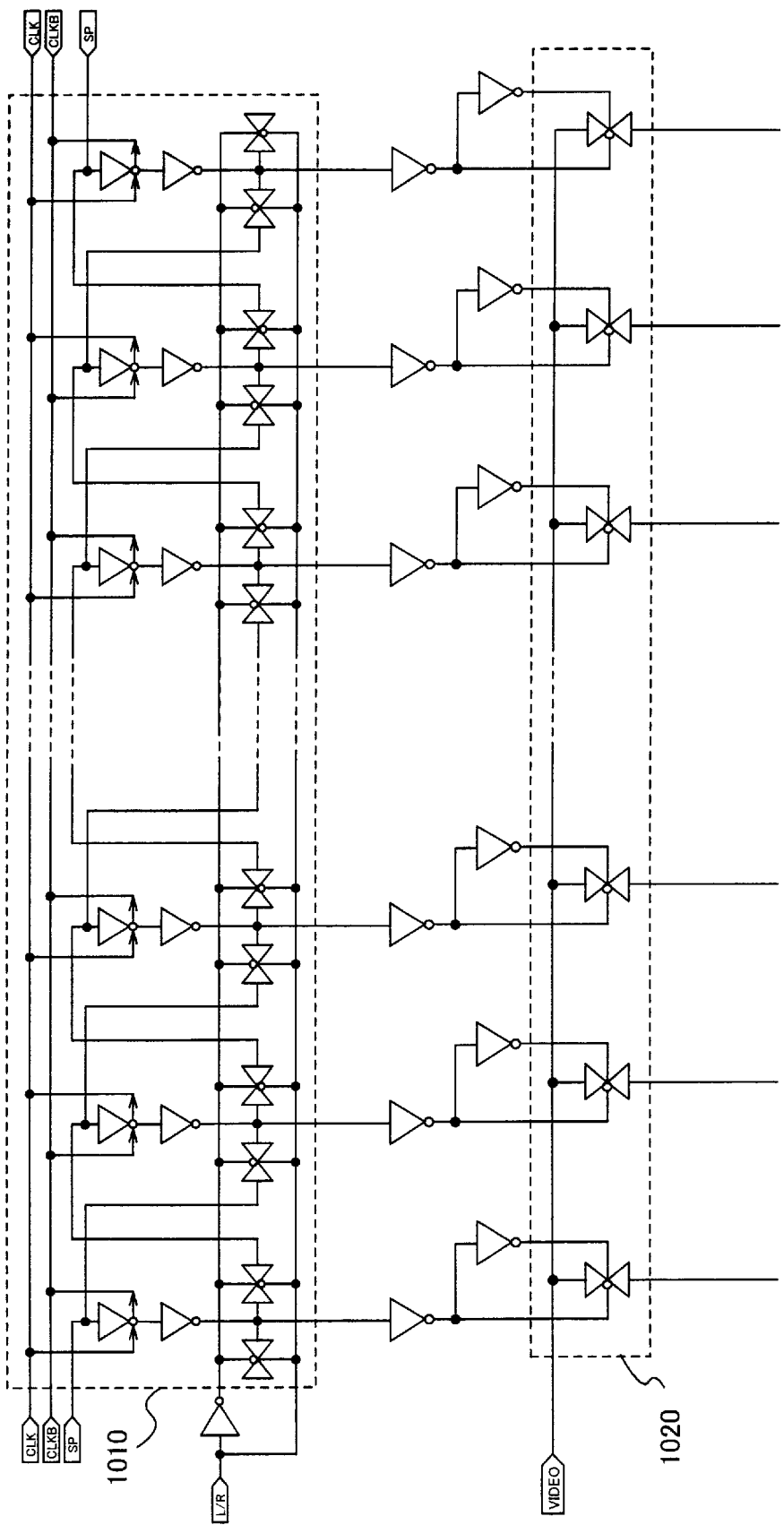
FIG. 6 is a circuit structural view of a driving circuit of the embodiment 1 using a shift register circuit of the present invention.

Reference will be made to FIG. 6. FIG. 6 shows the source driver 1000 of the liquid crystal display device of this embodiment. Reference numeral 1010 designates a shift register circuit of the present invention which includes a scan direction switching circuit. In this embodiment, the shift register circuit 1010 includes 1280 register circuits.

Reference numeral 1020 designates a sampling circuit and includes 1280 analog switches.

Figure 7:
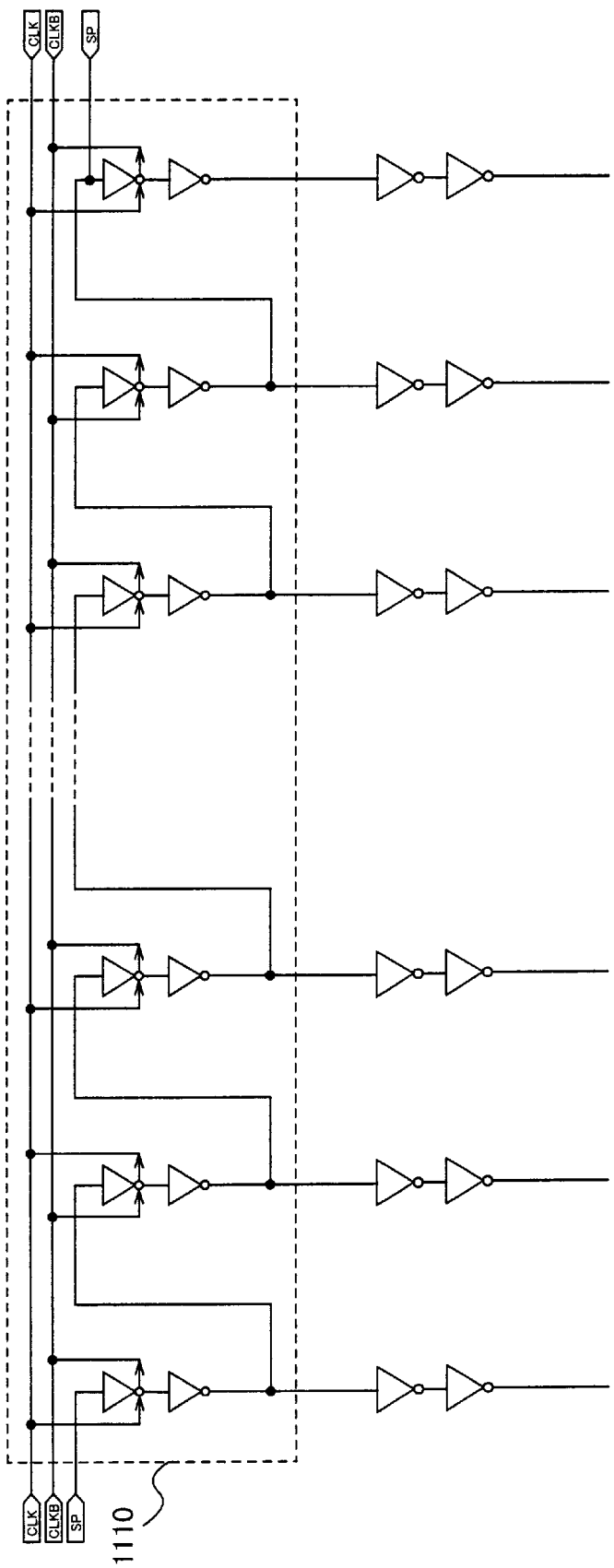
FIG. 7 is a circuit structural view of a driving circuit of the embodiment 1 using a shift register circuit of the present invention.

Next, reference will be made to FIG. 7. FIG. 7 shows the gate driver 1100 of the liquid crystal display device of this embodiment. Reference numeral 1110 designates a shift register circuit of the present invention. In this embodiment, the shift register circuit 1110 includes 1024 register circuits. Note that the gate driver 1200 is similar to the gate driver 1100.

[Embodiment 2]

In this embodiment, an example of a manufacturing process of a liquid crystal display device including a driving circuit of the present invention will be described with reference to FIGS. 8A to 12. In the liquid crystal display device of this embodiment, a pixel portion, a source driver, a gate driver, and the like are integrally formed on one substrate. Note that for convenience of explanation, there is shown a case where a pixel TFT, an Nch TFT constituting a part of the driving circuit of the present invention, a Pch TFT and an Nch TFT constituting an inverter circuit are formed on the same substrate.

In FIG. 8A, a low alkali glass substrate or a quartz substrate can be used as a substrate 6001. In the present embodiment, a low alkali glass substrate is used as the substrate 6001. In this case, the glass substrate may be thermally treated in advance at a temperature lower than the glass distortion point by 10 to 20° C. On the surface of the substrate 6001 where the TFTs are to be formed, for the purpose of preventing impurity diffusion from the substrate 6001, an base film 6002 comprising silicon oxide, silicon nitride, silicon nitride oxide, or the like is formed. For example, a silicon nitride oxide film formed from $SiH_4$, $NH_3$, and $N_2O$ may be formed by plasma CVD at a thickness of 100 nm, and a silicon nitride oxide film formed from $SiH_4$ and $N_2O$ may be formed similarly at a thickness of 200 nm to form lamination.

Next, a semiconductor film 6003a having the amorphous structure is formed by a known method such as plasma CVD or sputtering at a thickness of from 20 to 150 nm (preferably 30 to 80 nm). In the present embodiment, an amorphous silicon film is formed by plasma CVD at a thickness of 54 nm. Such semiconductor films having the amorphous structure include amorphous semiconductor films, microcrystalline semiconductor films, and the like, and a compound semiconductor film having the amorphous structure such as an amorphous silicon germanium film may also be used. Further, since the base film 6002 and an amorphous silicon film 6003a can be formed using the same film forming method, the two may be continuously formed. By not exposing the substrate to the atmosphere after the base film is formed thereon, contamination of the surface can be prevented, and thus, variation in the characteristics of the TFTs to be formed thereon and variation in the threshold voltage can be decreased (FIG. 8A).

Then, using known crystallization technique, a crystalline silicon film 6003b is formed from the amorphous silicon film 6003a. For example, laser crystallization or thermal crystallization (solid phase growth method) may be used. Here, according to the technique disclosed in Japanese Patent Application Laid-Open No. Hei 7-130652, with crystallization using a catalytic element, the crystalline silicon film 6003b is formed. Prior to the crystallization process, it is preferable to, depending on the amount of hydrogen contained in the amorphous silicon film, carry out heat treatment at 400 to 500° C. for about an hour to make the amount of hydrogen contained to be 5 atomic % or less. Since the atoms are rearranged to be denser when the amorphous silicon film is crystallized, the thickness of the crystalline silicon film to be formed is smaller than that of the original amorphous silicon film (54 nm in the present embodiment) by 1 to 15% (FIG. 8B).

Then, the crystalline silicon film 6003b is patterned to be island shape to form island shape semiconductor layers 6004 to 6007. After that, a mask layer 6008 is formed of silicon oxide film by plasma CVD or sputtering at a thickness of from 50 to 150 nm (FIG. 8C). In the present embodiment, the thickness of the mask layer 6008 is 130 nm.

Next, a resist mask 6009 is provided, and, for the purpose of controlling the threshold voltage, boron (B) is doped all over the surface of island shape semiconductor layers 6004 to 6007 for forming n-channel TFTs as an impurity element imparting p type at the concentration of from about $1\times10^{16}$ to $5\times10^{17}$ atoms/cm$^3$. Boron (B) may be doped by ion doping, or, alternatively, may be doped simultaneously with the formation of the amorphous silicon film. The boron (B) doping here is not always needed (FIG. 8D).

For the purpose of forming the LDD regions of the n-channel TFTs of the driving circuit etc., an impurity element imparting n type is selectively doped in the island shape semiconductor layers 6010 to 6012, which requires the formation of resist masks 6013 to 6016 in advance. As the impurity element imparting n type, phosphorus (P) or arsenic (As) may be used. Here, ion doping with phosphine ($PH_3$) is used to dope phosphorus (P). The concentration of phosphorus (P) in formed impurity regions 6017 and 6018 is in the range of from $2\times10^{16}$ to $5\times10^{19}$ atoms/cm$^3$. The concentration of the impurity element imparting n type contained in impurity regions 6017 to 6019 formed here is herein referred to as (n$^-$). An impurity region 6019 is a semiconductor layer for forming the storage capacitance of the pixel portion. Phosphorus (P) at the same concentration is also doped in this region (FIG. 9A). After that, the resist masks 6013 to 6016 are removed.

Next, the mask layer 6008 is removed with fluoric acid or the like and an activation step for the impurity elements doped in FIGS. 8D and 9A is carried out. The activation can be carried out by heat treatment in a nitrogen atmosphere at 500 to 600° C. for 1 to 4 hours or laser activation, or, the two may be used jointly. In the present embodiment, laser activation is adopted and KrF excimer laser light (wavelength: 248 nm) is used to form linear beams having the oscillating frequency of from 5 to 50 Hz and the energy density of from 100 to 500 mJ/cm$^2$ which scans with the overlapping ratio of from 80 to 98% to treat the whole surface of the substrate having the island shape semiconductor layers formed thereon. It is to be noted that there is no limitation on the conditions of the laser light irradiation, and the conditions may be appropriately decided.

Then, a gate insulating film 6020 is formed from an insulating film containing silicon by plasma CVD or sputtering at a thickness of from 10 to 150 nm. For example, a silicon nitride oxide film at a thickness of 120 nm is formed. A single layer or lamination of other insulating films containing silicon may also be used as the gate insulating film (FIG. 9B).

Next, to form gate electrodes, a first conductive layer is formed. Though the conductive layer may be a single-layer conductive layer, it may be the laminated structure of, for example, two or three layers, depending on the situation. In the present embodiment, a laminated layer consisting of a conductive layer (A) 6021 made from a conductive nitride metallic film and a conductive layer (B) 6022 made from a metallic film is formed. The conductive layer (B) 6022 may be formed of an element selected from tantalum (Ta), titanium (Ti), molybdenum (Mo), and tungsten (W), an alloy containing the foregoing elements as its main constituent, or an alloy film of a combination of the elements (typically Mo—W alloy film or Mo—Ta alloy film). The conductive layer (A) 6021 may be formed of tantalum nitride (TaN), tungsten nitride (WN), titanium nitride (TiN) or molybdenum nitride (MoN). Further, the conductive layer (A) 6021 also may be formed of tungsten silicide, titanium silicide or molybdenum silicide as a substitute material. As to the conductive layer (B) 6022, it is preferable that the concentration of the impurity contained for lowering resistance is reduced. In particular, the concentration of oxygen is desirable to be 30 ppm or less. For example, if the concentration of oxygen is 30 ppm or less, resistance value of 20 $\mu\Omega$cm or less can be realized with respect to tungsten (W).

The thickness of the conductive layer (A) 6021 is 10 to 50 nm (preferably 20 to 30 nm) while that of the conductive layer (B) 6022 is 200 to 400 nm (preferably 250 to 350 nm). In the present embodiment, a tantalum nitride film at a thickness of 50 nm is used as the conductive layer (A) 6021 while a Ta film at a thickness of 350 nm is used as the conductive layer (B) 6022, both of which are formed by sputtering. When sputtering is used to form the films, by adding an appropriate amount of Xe or Kr to Ar as the sputtering gas, the internal stress of the film to be formed can be alleviated to prevent the film from peeling off. Note that, although not shown, it is effective to form a silicon film at a thickness of from 2 to 20 nm, doped with phosphorus (P), under the conductive layer (A) 6021. This improves the adherence of the conductive layer to be formed thereon, and oxidation can be prevented. At the same time, a small amount of the alkaline element contained in the conductive layer (A) or the conductive layer (B) can be prevented from dispersing into the gate insulating film 6020 (FIG. 9C).

Then, resist masks 6023 to 6027 are formed and the conductive layers (A) 6021 and (B) 6022 are etched together to form gate electrodes 6028 to 6031, and capacitor wirings 6032. The gate electrodes 6028 to 6031 and the capacitor wiring 6032 are constructed of the conductive layers (A) 6028a to 6032a and the conductive layers (B) 6028b to 6032b which are integrally formed. Here, the gate electrodes 6028 to 6030 of TFTs, which constitute the driver circuits such as drivers later, are formed so as to overlap parts of the impurity regions 6017 and 6018 through the gate insulating film 6020 (FIG. 9D).

Then, for the purpose of forming the source and drain regions of the p-channel TFT of the driving circuit, a step of doping an impurity element imparting p type is carried out. Here, with the gate electrode 6028 being as the mask, the impurity region is formed in a self-aligning manner. Here, the regions where the n-channel TFTs are to be formed are covered with a resist mask 6033. Impurity regions 6034 are formed by ion doping using diborane ($B_2H_6$). The concentration of boron (B) in these regions is $3\times10^{20}$ to $3\times10^{21}$ atoms/cm$^3$. The concentration of the impurity element imparting p type contained in the impurity regions 6034 formed here is herein referred to as ($p^{++}$) (FIG. 10A).

Next, in the n-channel TFTs, impurity regions to function as source or drain regions are formed. Resist masks 6035 to 6037 are formed and an impurity element imparting n type is doped to form impurity regions 6038 to 6042. This is done by ion doping using phosphine ($PH_3$) with the concentration of phosphorus (P) in these regions being $1\times10^{20}$ to $1\times10^{21}$ atoms/cm$^3$. The concentration of the impurity element imparting n type contained in the impurity regions 6038 to 6042 formed here is herein referred to as ($n^+$) (FIG. 10B).

The impurity regions 6038 to 6042 already contain phosphorus (P) or boron (B) doped in previous steps, but since phosphorus (P) is doped at a sufficiently larger concentration, the influence of phosphorus (P) or boron (B) doped in the previous steps can be neglected. Further, since the concentration of phosphorus (P) doped in the impurity regions 6038 is ½ to ⅓ of that of boron (B) doped in FIG. 10A, the conductivity of p type is secured without influence on the TFT characteristics.

Then, for the purpose of forming the LDD regions of the n-channel TFT of the pixel portion, a step of doping impurity element imparting n type is carried out. Here, an impurity element imparting n type in a self-aligning manner is doped by ion doping with the gate electrode 6031 as a mask. The concentration of the doped phosphorus (P) is $1\times10^{16}$ to $5\times10^{18}$ atoms/cm$^3$. By carrying out the doping with the concentration lower than that of the impurity elements doped in FIGS. 9A, 10A, and 10B, only impurity regions 6049 and 6050 are formed. The concentration of the impurity element imparting n type contained in the impurity regions 6043 and 6044 formed here is herein referred to as ($n^+$) (FIG. 10C).

Here, an SiON film or the like may be formed at a thickness of 200 nm as an interlayer film in order to prevent the Ta film of the gate electrode from peeling off.

After that, a heat treatment step is carried out to activate the impurity elements imparting n or p type doped at the respective concentrations. The step can be carried out by furnace annealing, laser annealing, or rapid thermal annealing (RTA). Here, the activation step is carried out by furnace annealing. Heating is carried out at the concentration of oxygen of 1 ppm or less, preferably 0.1 ppm or less in a nitrogen atmosphere at 400 to 800° C., typically 500 to 600° C., here 500° C. for four hours. Further, in case of using a quartz substrate having heat resistance as the substrate 6001, a heat treatment may be carried out at 800° C. for 1 hour. Then, the activation of the impurity element can be realized, and an impurity region doped with the impurity element and a channel forming region are satisfactory jointed together. Note that this effect may not be obtained in the case of forming an interlayer film for preventing the Ta film of the gate electrode from peeling off.

In the above heat treatment, conductive layers (C) 6028c to 6032c are formed at a thickness of 5 to 80 nm on the surface of metallic films 6028b to 6032c comprising the gate electrodes 6028 to 6031 and the capacitor wiring 6032. For example, tungsten nitride (WN) and tantalum nitride (TaN) can be formed when the conductive layers (B) 6028b to 6032b are tungsten (W) and tantalum (Ta), respectively. Besides, the conductive layers (C) 6028c to 6032c can be formed similarly by exposing the gate electrodes 6028 to 6031 and the capacitor wiring 6032 in a plasma atmosphere containing nitrogen using nitrogen or ammonia. Then, a heat treatment is carried out in an atmosphere containing 3 to 100% of hydrogen at 300 to 450° C. for 1 to 12 hours to hydrogenate the island shape semiconductor layers. This process is a process where the dangling bonds in the semiconductor layers are terminated by thermally excited hydrogen. As other means for hydrogenation, plasma hydrogenation (hydrogen excited by plasma is used) may be carried out.

In the case where the island shape semiconductor layers are formed from an amorphous silicon film by crystallization using a catalytic element, a small amount of the catalytic element remains in the island shape semiconductor layers. Of course, it is still possible to complete a TFT in such a condition, but it is more preferable to remove the remaining catalytic element at least from the channel forming region. To utilize the gettering action by phosphorus (P) is a means for removing the catalytic element. The concentration of phosphorus (P) necessary for the gettering is about the same as that in the impurity region ($n^+$) formed in FIG. 10B. By the heat treatment in the activation process carried out here, the catalytic element can be gettered from the channel forming regions of the n-channel TFTs and the p-channel TFTs (FIG. 10D).

Figure 11A:
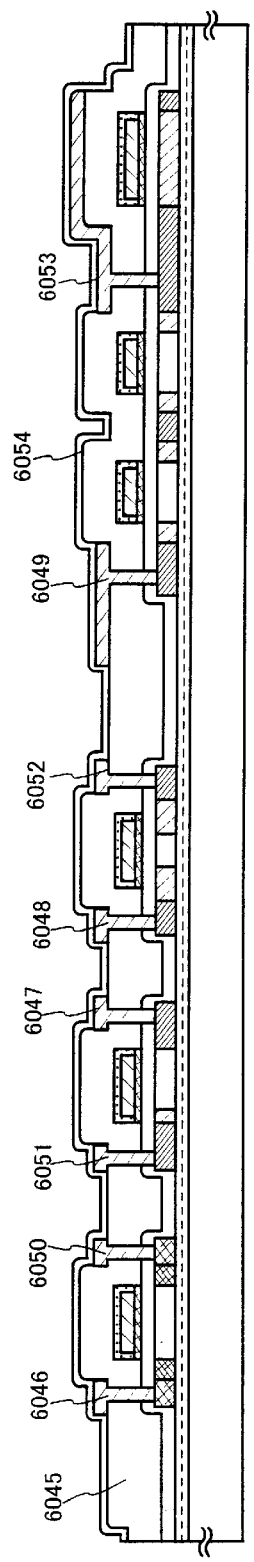
FIGS. 11A and 11B are views showing the manufacturing process of the liquid crystal display device using the driving circuit of the present invention.

A first interlayer insulating film 6045 is formed from a silicon oxide film or a silicon nitride oxide film at a thickness of from 500 to 1500 nm. After that, contact holes reaching the source regions or the drain regions formed in the respective island shape semiconductor layers, are formed, and source wirings 6046 to 6049 and drain wirings 6050 to 6053 are formed (FIG. 11A). Although not shown, in the present embodiment, the wirings is three-layer laminated structure formed of a Ti film at a thickness of 100 nm, an Al film containing Ti at a thickness of 500 nm, and another Ti film at a thickness of 150 nm, all formed continuously by sputtering.

Then, as a passivation film 6054, a silicon nitride film, a silicon oxide film, or a silicon nitride oxide film is formed at a thickness of from 50 to 500 nm (typically 100 to 300 nm). In the present embodiment, the passivation film 6054 is a lamination film of a silicon nitride film at a thickness of 50 nm and a silicon oxide film at a thickness of 24.5 nm. Hydrogenation treatment carried out in this condition resulted in sufficient improvement in the TFT characteristics. For example, heat treatment in an atmosphere containing 3 to 100% of hydrogen at 300 to 450° C. for 1 to 12 hours is preferable. Alternatively, use of plasma hydrogenation resulted in similar effects. Note that, here, an opening portion may be formed in the passivation film 6054 at a position where a contact hole for connecting a pixel electrode and the drain wirings is to be formed later (FIG. 11A).

Figure 11B:
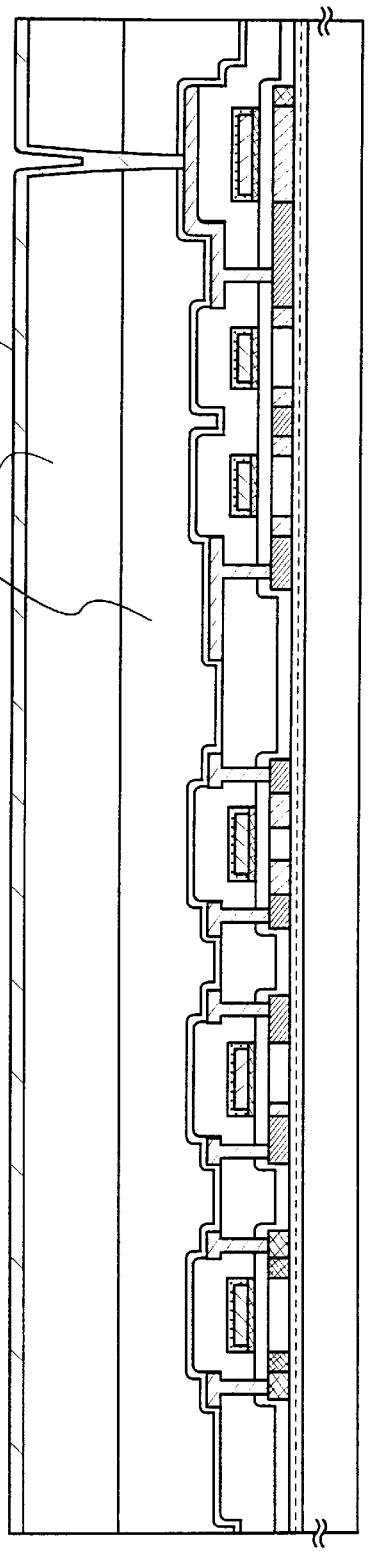

After that, a second interlayer insulating film 6055 comprising an organic resin is formed at a thickness of from 1.0 to 1.5 μm. As the organic resin, polyimide, acrylic resin, polyamide, polyimideamide, BCB (benzocyclobutene), or the like can be used. Here, acrylic resin of a thermal polymerization type after being applied to the substrate is used, and the film is formed by carrying out baking at 250° C. (FIG. 11B).

In this embodiment, a black matrix is made to have a laminate structure in which a Ti film is formed to a thickness of 100 nm, and then, an alloy film of Al and Ti is formed to a thickness of 300 nm.

After that, a third interlayer insulating film 6059 of an organic resin is formed at a thickness of from 1.0 to 1.5 μm. As the organic resin, polyimide, acrylic resin, polyamide, polyimideamide, BCB (benzocyclobutene), or the like can be used. Here, polyimide of a thermal polymerization type after being applied to the substrate is used, and the film is formed by carrying out baking at 300° C.

A contact hole reaching the drain wirings 6053 is formed in the second interlayer insulating film 6055 and the third interlayer insulating film 6059, and a pixel electrode 6060 is formed. In a transmission type liquid crystal display device according to the present invention, a transparent conductive film such as an indium tin oxide (ITO) film is used for the pixel electrode 6060 (FIG. 11B).

Figure 12:
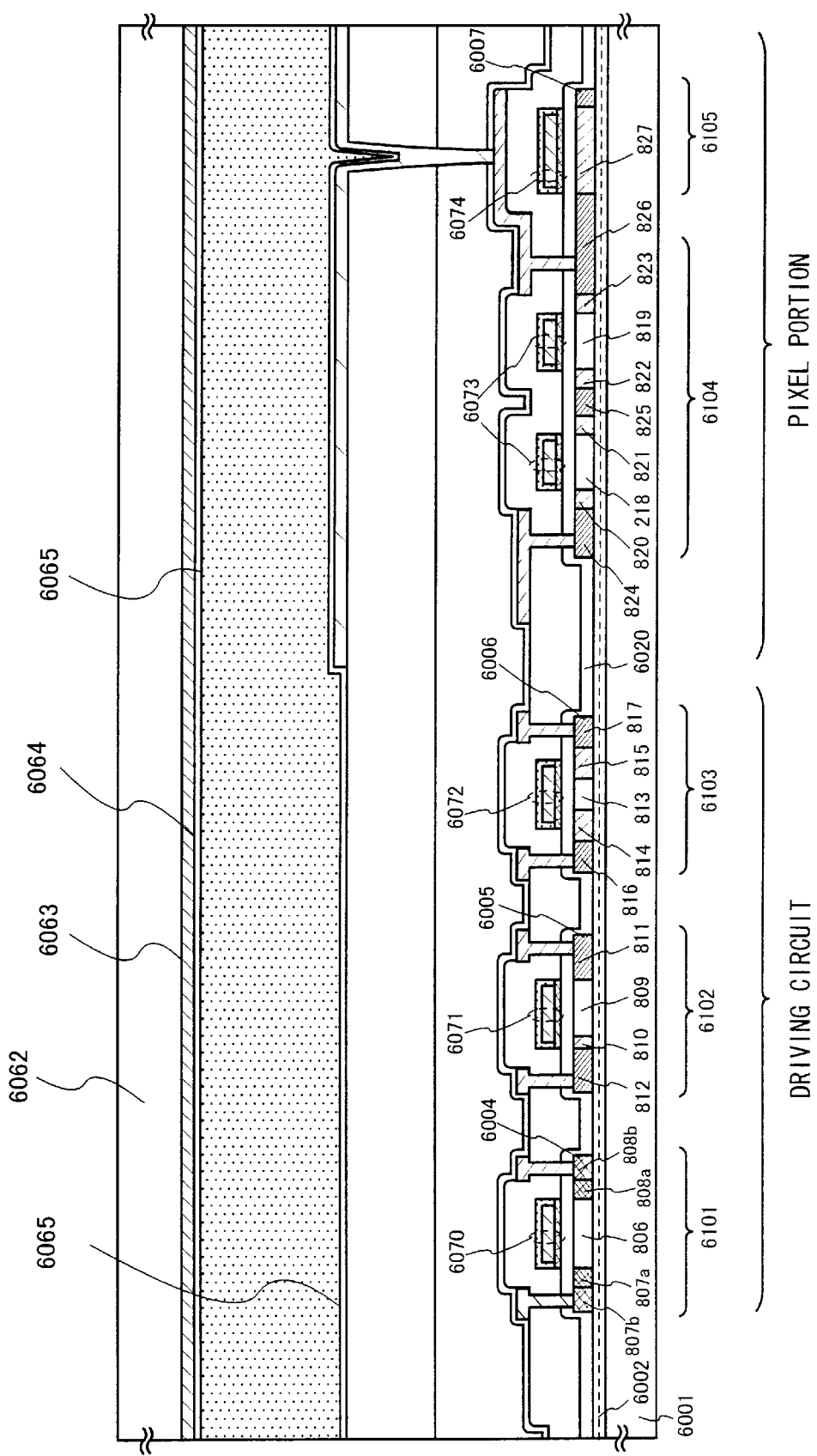
FIG. 12 is a view showing the manufacturing process of the liquid crystal display device using the driving circuit of the present invention.

In this way, a substrate having a driving circuit TFT and a pixel TFT in the pixel portion on the same substrate is completed. In the driving circuit, a p-channel TFT 6101, a first n-channel TFT 6102, and a second n-channel TFT 6103 are formed. In the pixel portion, a pixel TFT 6104 and a storage capacitance 6105 are formed (FIG. 12). Such a substrate is herein referred to as an active matrix substrate for convenience.

A process of manufacturing a transmission type liquid crystal display device will be explained next on the basis of the active matrix substrate manufactured by the above steps.

An orientation film 6061 is formed for the active matrix substrate in the state of FIG. 12. In this embodiment, a polyimide is used for the orientation film 6061. Next, an opposing substrate is prepared. The opposing substrate is formed of a glass substrate 6062, an opposing electrode 6063 made from a transparent conductive film, and an orientation film 6064.

In this embodiment, a polyimide resin film in which liquid crystal molecules are orientated parallel to the substrate is used for the orientation film. Note that, after forming the alignment films, a rubbing process is performed to give the liquid crystal molecules a certain fixed pre-tilt angle, bringing them into parallel orientation.

The active matrix substrate and the opposing substrate which have undergone the above steps are then adhered to each other by a known cell assembling process through a sealing material or a spacer (neither is shown). After that, liquid crystal 6065 is injected between the substrates and a sealant (not shown) is used to completely seal the substrates. A transmission type liquid crystal display device as shown in FIG. 12 is thus completed.

In the present embodiment, the transmission type liquid crystal display device is designed to operate in a TN (Twisted Nematic) mode. Accordingly, a polarizing plate (not shown) is disposed on the transmission type liquid crystal display device.

The p-channel TFT 6101 of the driving circuit has a channel forming region 806, source regions 807a and 807b, and drain regions 808a and 808b in the island shape semiconductor layer 6004. The first n-channel TFT 6102 has a channel forming region 809, an LDD region 810 (hereafter referred to as $L_{ov}$ for LDD regions), a source region 811, and a drain region 812 in the island shape semiconductor layer 6005. The length of the $L_{ov}$ region in the direction of the channel length is 0.5 to 3.0 μm, preferably 1.0 to 1.5 μm. The second n-channel TFT 6103 has a channel forming region 813, LDD regions 814 and 815, a source region 816, and a drain region 817 in the island shape semiconductor layer 6006. The LDD regions can be divided into an $L_{ov}$ region and an LDD region which does not overlap with the gate electrode 6072 (hereafter referred to as $L_{off}$ region). The length of the $L_{off}$ region in the direction of the channel length is 0.3 to 2.0 μm, preferably 0.5 to 1.5 μm. The n-channel TFT 6104 has channel forming regions 818 and 819, $L_{off}$ regions 820 to 823, and source or drain regions 824 to 826. The length of the $L_{off}$ regions in the direction of the channel length is 0.5 to 3.0 μm, preferably 1.5 to 2.5 μm. An offset region (not shown) is formed between channel forming regions 818 and 819 and $L_{off}$ regions 820 to 823 (LDD regions of the pixel TFT). Further, a storage capacitance 805 is formed of the capacitor wirings 6074, an insulating film formed of the gate insulating film 6020, and a semiconductor layer 827 with an impurity element imparting n type doped therein for connecting with the drain region 826 of the pixel TFT 6073. In FIG. 12, the pixel TFT 804 of the pixel portion has the double gate structure, but it may have the single gate structure, or the multi gate structure provided with a plurality of gate electrodes.

By appropriately selecting the structure of TFTs disposed in the respective circuits in accordance with specifications for the pixel TFT and a driver, the operating performance and the reliability of the liquid crystal display device can be improved.

Note that the description has been made on the transmission type liquid crystal display device. However, a liquid crystal display device which can use a driving circuit of the present invention is not limited to this, but the driving circuit can also be used in a reflection type liquid crystal display device.

[Embodiment 3]

In this embodiment, a description will be made on an example in which a liquid crystal display device including a driving circuit of the present invention is constituted by using a reversed stagger type TFT.

Figure 13A:
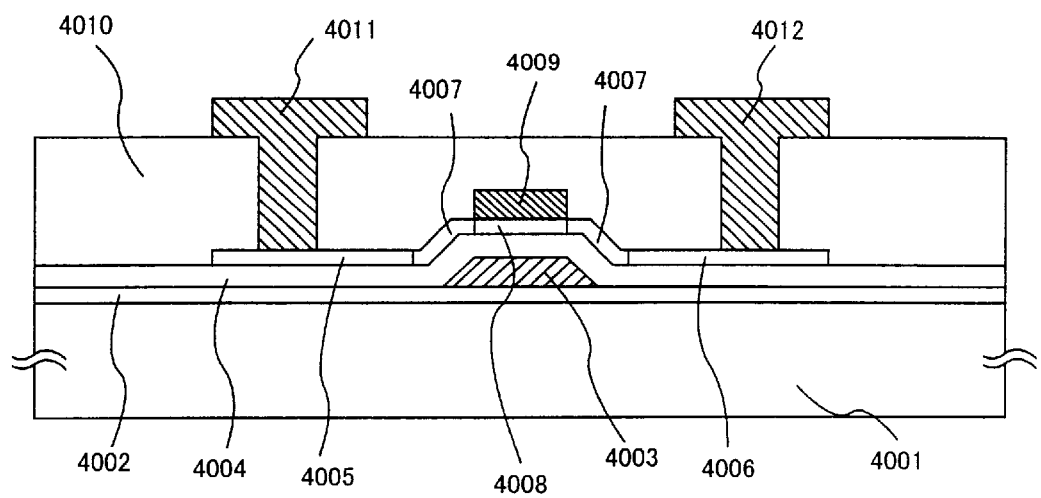
FIGS. 13A and 13B are sectional views of liquid crystal display devices using driving circuits of the present invention.
Figure 13B:
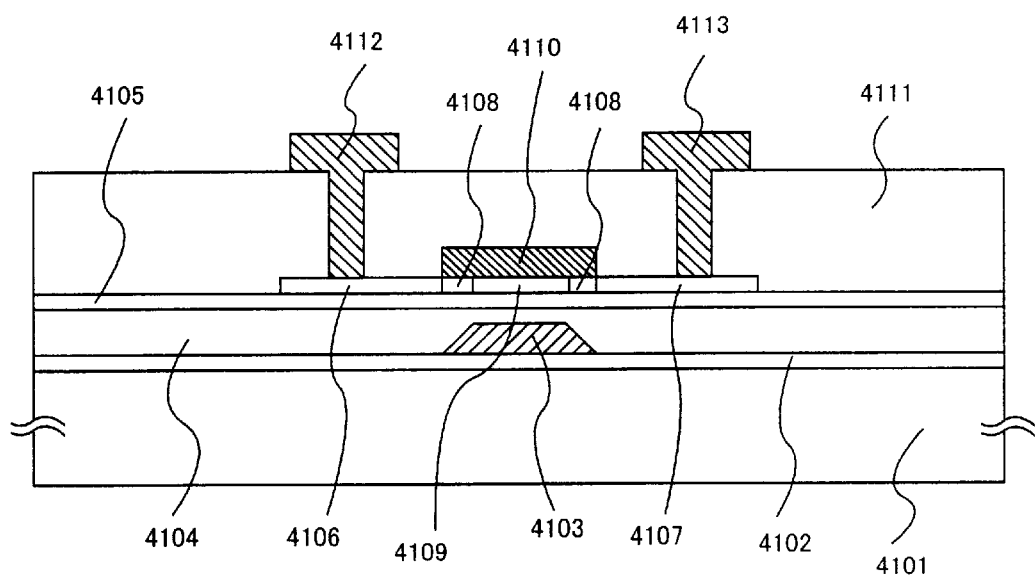

Reference will be made to FIGS. 13A and 13B. FIGS. 13A and 13B are sectional views, each showing a reversed stagger type N-channel TFT constituting a liquid crystal display device of this embodiment. Although FIGS. 13A and 13B show only one N-channel TFT, it is needless to say that a CMOS circuit can also be constituted by a P-channel TFT and an N-channel TFT. Besides, it is needless to say that a pixel TFT can be constituted by a similar structure.

Reference will be made to FIG. 13A. Reference numeral 4001 designates a substrate, and one as explained in embodiment 2 is used. Reference numeral 4002 designates a silicon oxide film; 4003, a gate electrode; 4004, a gate insulating film; and 4005, 4006, 4007, and 4008, active layers made of polycrystalline silicon films. In fabrication of the active layers, a method similar to poly-crystallization of an amorphous silicon film explained in the embodiment 2 was used. A method of crystallizing an amorphous silicon film by laser light (preferably, linear laser light or planar laser light) may be adopted. Note that reference numeral 4005 designates a source region; 4006, a drain region; 4007, a low concentration impurity region (LDD region); and 4008, a channel formation region. Reference numeral 4009 designates a channel protection film; and 4010, an interlayer insulating film. Reference numerals 4011 and 4012 designate a source electrode and a drain electrode, respectively.

Next, reference will be made to FIG. 13B. A case where a liquid crystal display device is constituted by a reversed stagger type TFT different from that of FIG. 13A in structure will be described with reference to FIG. 13B.

In FIG. 13B as well, although only one N-channel TFT is shown, it is needless to say that a CMOS circuit can be constituted by a P-channel TFT and an N-channel TFT as described above. Besides, it is needless to say that a pixel TFT can be constituted by a similar structure.

Reference numeral 4101 designates a substrate; 4102, a silicon oxide film; 4103, a gate electrode; 4104, a benzocyclobutene (BCB) film an upper surface of which is flattened; and 4105, a silicon nitride film. The BCB film and the silicon nitride film constitute a gate insulating film. Reference numerals 4106, 4107, 4108 and 4109 designate active layers made of polycrystalline silicon films. In fabrication of the active layers, a method similar to poly-crystallization of an amorphous silicon film explained in the embodiment 2 was used. Besides, a method of crystallizing an amorphous silicon film by laser light (preferably, linear laser light or planar laser light) may be adopted. Note that reference numeral 4106 designates a source region; 4107, a drain region; 4108, a low concentration impurity region (LDD region); and 4109, a channel formation region. Reference numeral 4110 designates a channel protection film; and 4111, an interlayer insulating film. Reference numerals 4112 and 4113 designate a source electrode and a drain electrode, respectively.

According to this embodiment, since the gate insulating film constituted by the BCB film and the silicon nitride film is flattened, an amorphous silicon film formed thereon also becomes flat. Thus, when an amorphous silicon film is poly-crystallized, it is possible to obtain a polycrystalline silicon film more uniform than a conventional reversed stagger type TFT.

[Embodiment 4]

In addition to nematic liquid crystals, it is possible to use various kinds of liquid crystals for the above stated liquid crystal display device using the semiconductor circuit of the present invention. For example, it is possible to use the liquid crystals published in any of the following papers: Furue, H. et al, "Characteristics and Driving Scheme of Polymer-Stabilized Monostable FLCD Exhibiting Fast Response Time and High Contrast Ratio with Gray-Scale Capability", SID, 1998; Yoshida, T. et al, "A Full-Color Thresholdless Antiferroelectric LCD Exhibiting Wide Viewing Angle with Fast Response Time", SID Digest, 814, 1997; Inui, S. et al, "Thresholdless Antiferroelectricity in Liquid Crystals and its Application to Displays", J. Mater. Chem., 6(4), 1996, p. 671–3; and disclosed in U.S. patent application Ser. No. 5,594,569.

A liquid crystal which exhibits an antiferroelectric phase in a certain temperature range is called an antiferroelectric liquid crystal. There are mixed liquid crystals, which have an antiferroelectric liquid crystal, which show electro-optical response characteristics in which the transmissivity continuously changes in response to the electric field, and are called thresholdless antiferroelectric mixed liquid crystals. There are thresholdless antiferroelectric mixed liquid crystals that show so-called V-type electro-optical response characteristics, and some have been shown to have a driver voltage of approximately ±2.5 V (when the cell thickness is between 1 µm and 2 µm).

An example showing the characteristics of the optical transmissivity with respect to the voltage applied to a thresholdless antiferroelectric mixed liquid crystal showing so-called V-type electro-optical response characteristics is shown in FIG. 16. The vertical axis of the graph shown in FIG. 16 is the transmissivity (in arbitrary units), and the horizontal axis is the applied voltage. Note that the transmission axis of the polarizing plate on the incidence side is set nearly parallel to the direction normal to the smectic layer of the thresholdless antiferroelectric mixed liquid crystal which is nearly in agreement with the rubbing direction of the liquid crystal display device. Further, the transmission axis of the polarizing plate on the outgoing side is set nearly perpendicular (crossed Nichols) to the transmission axis of the polarizing plate on the incidence side.

Figure 14:
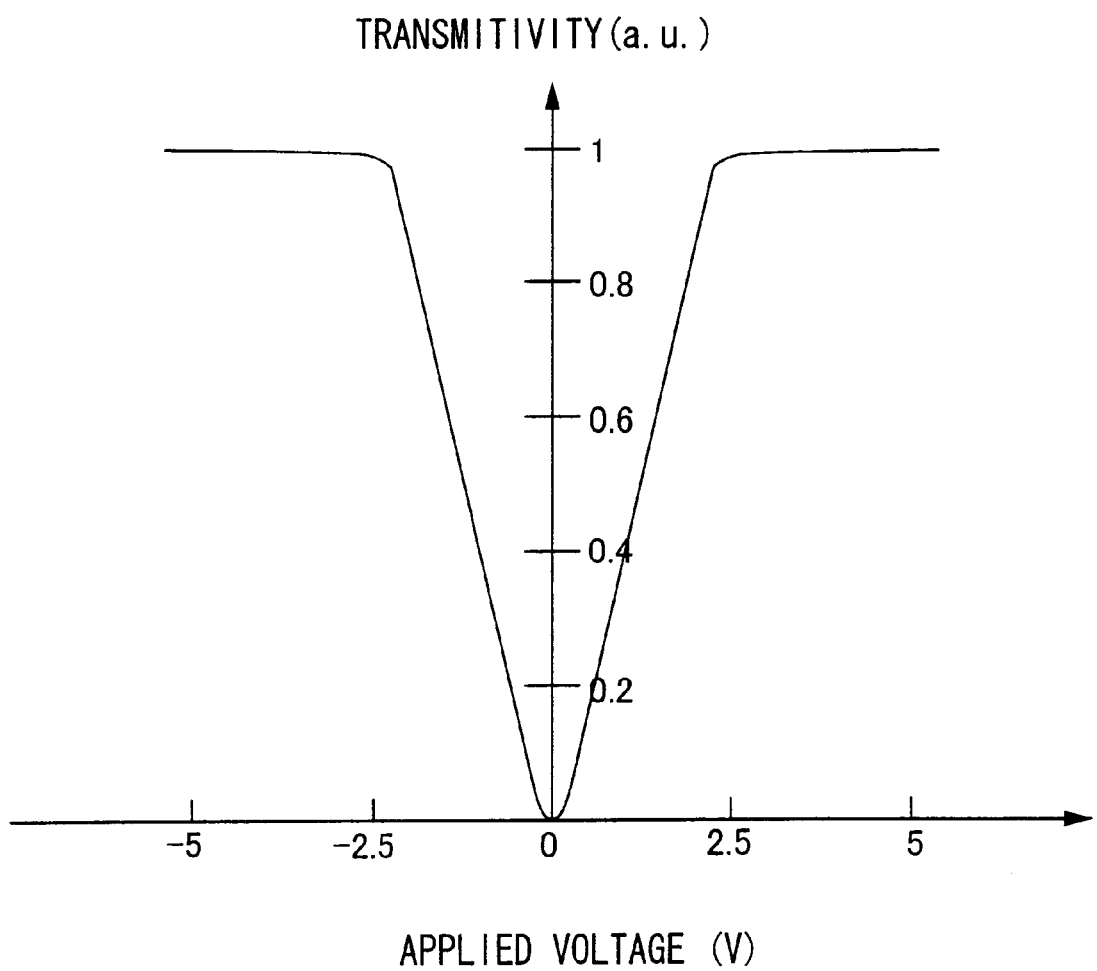
FIG. 14 is a graph showing applied voltage—transmissivity characteristics of antiferroelectric liquid crystal indicating V-shaped electro-optical characteristics.

As shown in FIG. 14, it is apparent that if this type of thresholdless antiferroelectric mixed liquid crystal is used, it is possible to have a low voltage drive and a gradation display.

Furthermore, the output voltage of a D/A converter circuit can be reduced in case of using a liquid crystal display device having the driving circuit of the present invention with this type of low voltage driven thresholdless antiferroelectric mixed liquid crystal, and therefore the operation power source voltage for the D/A converter circuit can be lowered, and the operation power source voltage of the driver can be reduced. Consequently, a liquid crystal display device with low power consumption and high reliability can be realized.

Thus, the use of this kind of low voltage driven thresholdless antiferroelectric mixed liquid crystal is also effective in case of using TFTs having a relatively small LDD region (low concentration impurity region) width (for example, from 0 nm to 500 nm, or from 0 nm to 200 nm).

Further, the spontaneous polarization of a thresholdless antiferroelectric mixed liquid crystal is large in general, and the dielectric constant of the liquid crystal itself is high. Thus a pixel needs a relatively large storage capacitance when a thresholdless antiferroelectric mixed liquid crystal is used for a liquid crystal display device. Therefore, it is desirable to use a thresholdless antiferroelectric mixed liquid crystal that has a small spontaneous polarization.

Note that by using this type of thresholdless antiferroelectric mixed liquid crystal in the liquid crystal display devices of the present invention, a low voltage drive can be realized, so low power consumption can also be realized.

Furthermore, provided a liquid crystal having electro-optical characteristics like those shown in FIG. 14, any type of liquid crystal can be used as the display medium of the liquid crystal display device using the driving circuit of the present invention.

[Embodiment 5]

A liquid crystal display device including a driving circuit of the present invention can be incorporated and used in various electronic instruments.

As such electronic instruments, a video camera, a digital camera, a projector (rear type or front type), a head mount display (goggle type display), a game machine, a car navigation system, a personal computer, a portable information terminal (mobile computer, portable telephone, electronic book, etc.), and the like can be enumerated. Examples of those will be shown in FIGS. 15 and 15B and FIGS. 16A to 16F.

Figure 15A:
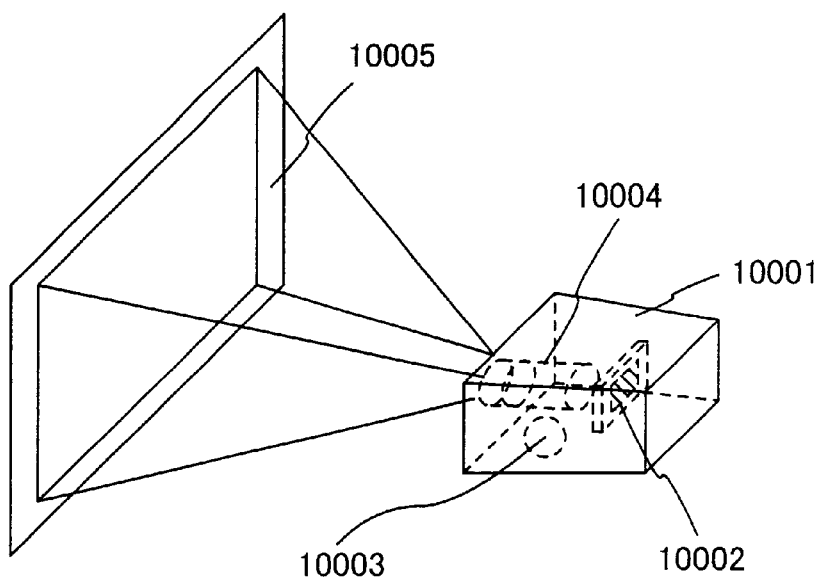
FIGS. 15A and 15B show examples of electronic instruments each incorporating a liquid crystal display device using a driving circuit of the present invention.

FIG. 15A shows a front type projector which is constituted by a main body 10001, a liquid crystal display device 10002 using a driving circuit of the present invention, a light source 10003, an optical system 10004, and a screen 10005. Although FIG. 15A shows the front projector including one liquid crystal display device, when three liquid crystal display devices (made to correspond to light of R, G and B) are incorporated, a front type projector with higher resolution and high fineness can be realized.

Figure 15B:
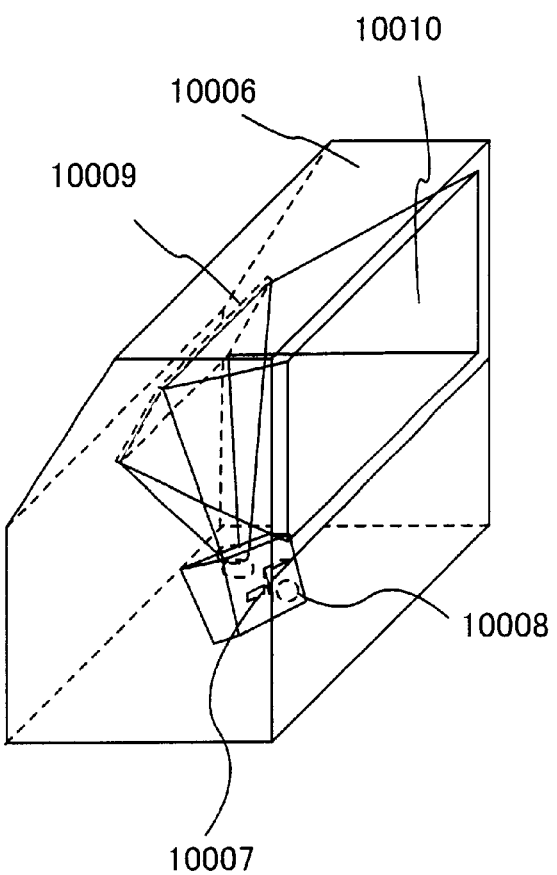
Figure 17:
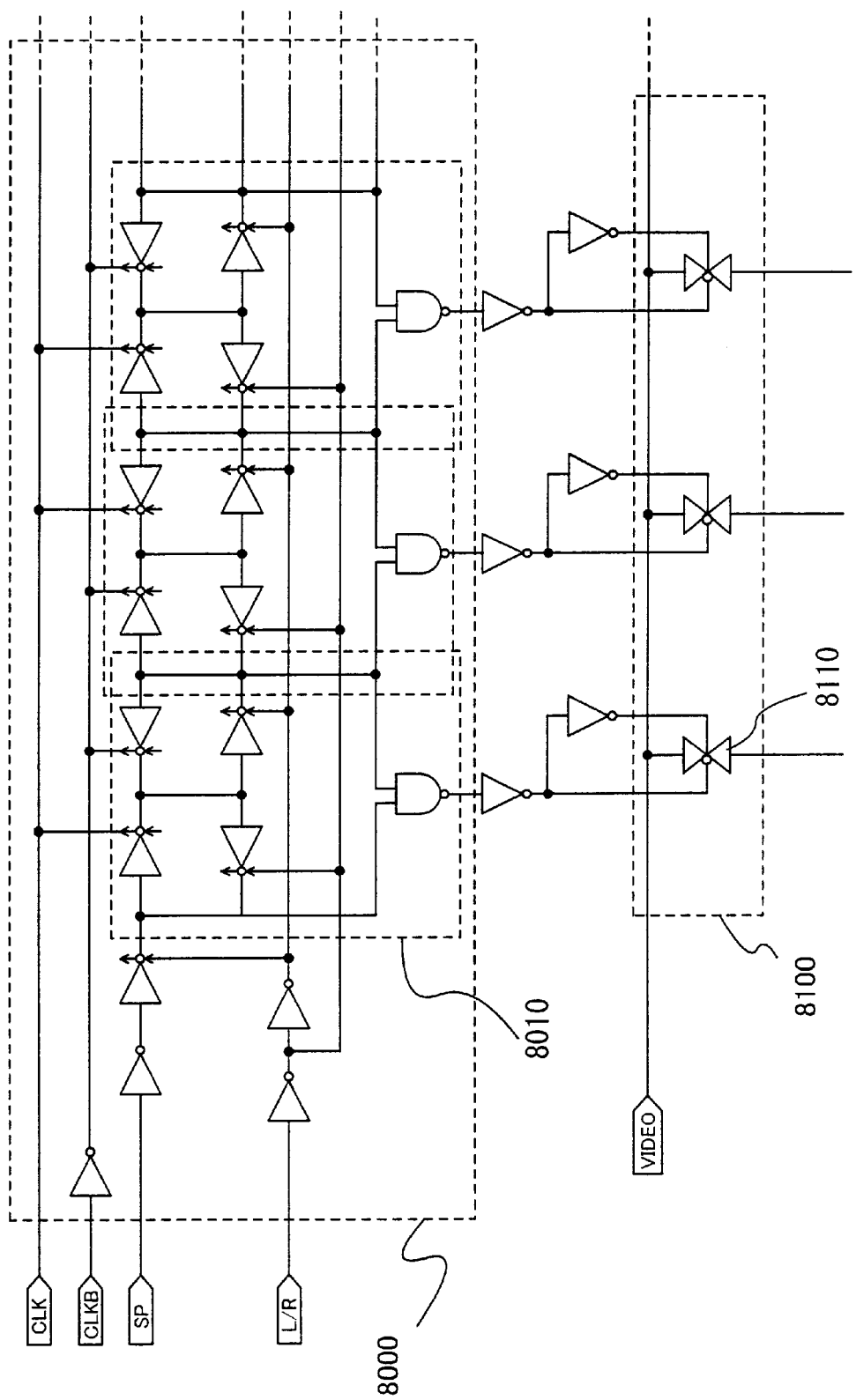
FIG. 17 is a circuit structural view of a conventional driving circuit.
Figure 18:
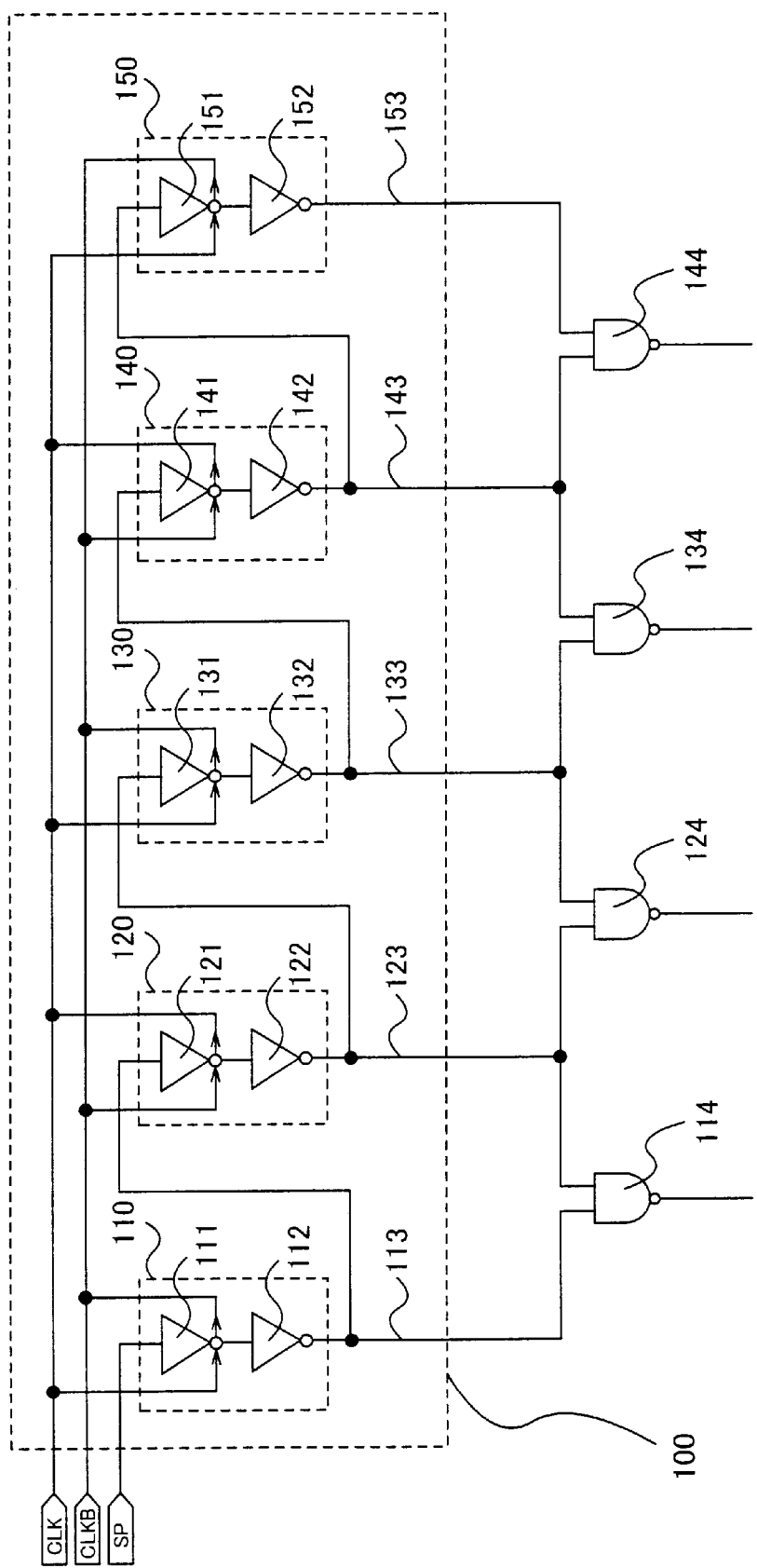
FIG. 18 is a circuit structural view of a driving circuit including a shift register circuit of the present invention.

FIG. 15B shows a rear type projector which is constituted by a main body 10006, a liquid crystal display device 10007 using a driving circuit of the present invention, a light source 10008, a reflector 10009, and a screen 10010. FIG. 15B shows the rear type projector including three liquid crystal display devices (made to correspond to light of R, G, and B). It is also possible to provide a rear type projector including one liquid crystal display device including a driving circuit of the present invention.

FIG. 16A shows a personal computer which is constituted by a main body 7001, an image input portion 7002, a liquid crystal display device 7003 using a driving circuit of the present invention, and a keyboard 7004.

FIG. 16B shows a video camera which is constituted by a main body 7101, a liquid crystal display device 7102 using a driving circuit of the present invention, an audio input portion 7103, an operation switch 7104, a battery 7105, and an image receiving portion 7106.

FIG. 16C shows a mobile computer which is constituted by a main body 7201, a camera portion 7202, an image receiving portion 7203, an operation switch 7204, and a liquid crystal display device 7205 using a driving circuit of the present invention.

FIG. 16D shows a goggle type display which is constituted by a main body 7301, a liquid crystal display device 7302 using a driving circuit of the present invention, and an arm portion 7303.

FIG. 16E shows a player using a recording medium recording a program (hereinafter referred to as a "recording medium"), which is constituted by a main body 7401, a liquid crystal display device 7402 using a driving circuit of the present invention, a speaker portion 7403, a recording medium 7404, and an operation switch 7405. This apparatus uses a DVD (Digital Versatile Disc), a CD, or the like as the recording medium, and appreciation of music or movie, a game, or the Internet can be performed.

FIG. 16F shows a game machine which is constituted by a main body 7501, a liquid crystal display device 7502 using a driving circuit of the present invention, a display device 7503, a recording medium 7504, a controller 7505, a sensor portion 7506 for a main body, a sensor portion 7507, and a CPU portion 7508. The sensor portion 7506 for the main body and the sensor portion 7507 can detect infrared rays emitted from the controller 7505 and the main body 7501, respectively.

As described above, the scope of application of a liquid crystal display device using a driving circuit of the present invention is very wide, and the device can be applied to electronic instruments of any fields.

Consequently, the structure of the driving circuit of the present invention is simplified as compared with a conventional driving circuit, and the number of elements is not larger than half of that of the conventional circuit. Thus, in the liquid crystal display device using the driving circuit of the present invention, production yield is improved and miniaturization can be realized.

What is claimed is:

1. A semiconductor device having at least one driving circuit, said driving circuit comprising:

a plurality of register circuits, each register circuit including a clocked inverter circuit and an inverter circuit connected in series with each other, and a signal line; and a scan direction switching circuit including a plurality of switching circuits, wherein the clocked inverter circuit and the inverter circuit of one of the register circuits generate a timing pulse based on a clock signal, a clock back signal, and a start pulse inputted externally, and output the timing pulse to an adjacent register circuit and the scan direction switching circuit, and wherein the scan direction switching circuit controls a direction of the timing pulse outputted from the register circuit based on a scan direction switching signal (L/R).

2. A semiconductor device having at least one driving circuit, said driving circuit comprising:

first, second, . . . , (n−1)th, and n-th register circuits (n is a natural number), each register circuit including a clocked inverter circuit and an inverter circuit connected in series with each other, and a signal line; and a scan direction switching circuit including first, second, . . . , (n−1)th, and n-th switching circuits, wherein a timing pulse outputted from the signal line of the (n−1)th register circuit is inputted to an adjacent register circuit, and wherein the scan direction switching circuit controls a direction of the timing pulse outputted from the (n−1)th register circuit based on a scan direction switching signal (L/R).

3. A semiconductor device having at least one driving circuit, said driving circuit comprising:

first, second, . . . , (n−1)th, and n-th register circuits (n is a natural number), each register circuit including a clocked inverter circuit and an inverter circuit connected in series with each other, and a signal line; and a scan direction switching circuit including first, second, . . . , (n−1)th, and n-th switching circuits, wherein the clocked inverter circuit and the inverter circuit of each of the first, second, . . . , (n−1)th, and n-th register circuits generate a timing pulse based on a clock signal, a clock back signal, and a start pulse inputted externally, and wherein the (n−1)th register circuit outputs the timing pulse to an adjacent register circuit and a signal line of the (n−1)th register circuit, and wherein the scan direction switching circuit controls a direction of the timing pulse outputted from the (n−1)th register circuit based on a scan direction switching signal (L/R).

4. A semiconductor device comprising:
a shift register circuit including a plurality of register circuits, each register circuit including a clocked inverter circuit and an inverter circuit connected in series with each other;
a scan direction switching circuit including a plurality of switching circuits; and
a sampling circuit including a plurality of analog switches,
wherein the clocked inverter circuit and the inverter circuit of one of the register circuits generate a timing pulse based on a clock signal, a clock back signal, and a start pulse inputted externally, and output the timing pulse to the scan direction switching circuit and an adjacent register circuit, and
wherein the scan direction switching circuit controls a direction of the timing pulse outputted from the register circuit based on a scan direction switching signal (L/R).

5. A semiconductor device comprising:
a shift register circuit including first, second, ..., (n−1)th, and n-th register circuits (n is a natural number), each register circuit including a clocked inverter circuit and an inverter circuit connected in series with each other;
a scan direction switching circuit including first, second, ..., (n−1)th, and n-th switching circuits; and
a sampling circuit including first, second, ..., (n−1)th, and n-th analog switches,
wherein a timing pulse outputted from the (n−1)th register circuit is inputted to the (n−1)th switching circuit and an adjacent register circuit,
wherein the scan direction switching circuit controls a direction of the timing pulse outputted from the (n−1)th register circuit based on a scan direction switching signal (L/R), and
wherein the analog switch samples externally inputted video data based on the inputted timing pulse.

6. A semiconductor device comprising:
a shift register circuit including first, second, ..., (n−1)th, and n-th register circuits (n is a natural number), each register circuit including a clocked inverter circuit and an inverter circuit connected in series with each other;
a scan direction switching circuit including first, second, ..., (n−1)th, and n-th switching circuits; and
a sampling circuit including first, second, ..., (n-t)th, and n-th analog switches,
wherein the clocked inverter circuit and the inverter circuit of each of the first, second, ..., (n−1)th, and n-th register circuits generate a timing pulse based on a clock signal, a clock back signal, and a start pulse externally inputted,
wherein the (n−1)th register circuit outputs the timing pulse to the (n−1)th switching circuit and an adjacent register circuit,
wherein the scan direction switching circuit controls a direction of the timing pulse outputted from the (n−1)th register circuit based on a scan direction switching signal (L/R), and
wherein the analog switch samples externally inputted video data based on the inputted timing pulse.

7. A semiconductor device comprising:
a shift register circuit including first, second, ..., (n−1)th, and n-th register circuits (n is a natural number), each register circuit including a clocked inverter circuit and an inverter circuit connected in series with each other; and
a scan direction switching circuit including first, second, ..., (n−1)th, and n-th switching circuits, each switching circuit including two analog switches,
wherein a timing pulse outputted from the (n−1)th register circuit is inputted to the (n−1)th switching circuit, and
wherein the (n−1)th switching circuit outputs the timing pulse to one of (n−2)th and n-th register circuits based on an externally inputted scan direction switching signal.

8. A semiconductor device comprising:
a shift register circuit including first, second, ..., (n−1)th, and n-th register circuits (n is a natural number), each register circuit including a clocked inverter circuit and an inverter circuit connected in series with each other; and
a scan direction switching circuit including first, second, ..., (n−1)th, and n-th switching circuits, each switching circuit including two analog switches,
wherein the clocked inverter circuit and the inverter circuit of each of the first, second, ..., (n−1)th, and n-th register circuits generate a timing pulse based on a clock signal, a clock back signal, and a start pulse externally inputted,
wherein the timing pulse outputted from the (n−1)th register circuit is inputted to the (n−1)th switching circuit, and
wherein the (n−1)th switching circuit outputs the timing pulse to one of (n−2)th and n-th register circuits based on an externally inputted scan direction switching signal.

9. A semiconductor device comprising:
a shift register circuit including first, second, ..., (n−1)th, and n-th register circuits (n is a natural number), each register circuit including a clocked inverter circuit and an inverter circuit connected in series with each other;
a scan direction switching circuit including first, second, ..., (n−1)th, and n-th switching circuits, each switching circuit including two analog switches; and
a sampling circuit including first, second, ..., (n−1)th, and n-th analog switches,
wherein a timing pulse outputted from the (n−1)th register circuit is inputted to the (n−1)th switching circuit,
wherein the (n−1)th switching circuit outputs, based on an externally inputted scan direction switching signal, the timing pulse to the (n-2)th or n-th register circuit and the (n−1)th analog switch, and
wherein the analog switch samples externally inputted video data based on the inputted timing pulse.

10. A semiconductor device comprising:
a shift register circuit including first, second, ..., (n−1)th, and n-th register circuits (n is a natural number), each register circuit including a clocked inverter circuit and an inverter circuit connected in series with each other;
a scan direction switching circuit including first, second, ..., (n−1)th, and n-th switching circuits, each switching circuit including two analog switches; and
a sampling circuit including first, second, ..., (n−1)th, and n-th analog switches,
wherein the clocked inverter circuit and the inverter circuit of each of the first, second, ..., (n−1)th, and n-th register circuits generate a timing pulse based on a clock signal, a clock back signal, and a start pulse externally inputted, wherein the timing pulse outputted from the (n−1)th register circuit is inputted to the (n−1)th switching circuit, wherein the (n−1)th switching circuit outputs, based on an externally inputted scan direction switching signal, the timing pulse to the (n−2)th or n-th register circuit and the (n−1)th analog switch, and wherein the analog switch samples externally inputted video data based on the inputted timing pulse.

11. A display device comprising a driver circuit according to claim 1.

12. A rear projector comprising three display devices, each display device according to claim 11.

13. A front projector comprising three display devices, each display device according to claim 11.

14. A rear projector comprising a display device according to claim 11.

15. A front projector comprising a display device according to claim 11.

16. A head mount display comprising a display device according to claim 11.

17. A computer comprising a display device according to claim 11.

18. A video camera comprising a display device according to claim 11.

19. A DVD player comprising a display device according to claim 11.

20. A game machine comprising a display device according to claim 11.

21. A display device comprising a semiconductor device according to claim 4.

22. A rear projector comprising three display devices, each display device according to claim 21.

23. A front projector comprising three display devices, each display device according to claim 21.

24. A rear projector comprising a display device according to claim 21.

25. A front projector comprising a display device according to claim 21.

26. A head mount display comprising a display device according to claim 21.

27. A computer comprising a display device according to claim 21.

28. A video camera comprising a display device according to claim 21.

29. A DVD player comprising a display device according to claim 21.

30. A game machine comprising a display device according to claim 21.

31. A display device comprising a shift register circuit according to claim 2.

32. A rear projector comprising three display devices, each display device according to claim 31.

33. A front projector comprising three display devices, each display device according to claim 31.

34. A rear projector comprising a display device according to claim 31.

35. A front projector comprising a display device according to claim 31.

36. A head mount display comprising a display device according to claim 31.

37. A computer comprising a display device according to claim 31.

38. A video camera comprising a display device according to claim 31.

39. A DVD player comprising a display device according to claim 31.

40. A game machine comprising a display device according to claim 31.

41. A display device comprising a shift register circuit according to claim 3.

42. A rear projector comprising three display devices, each display device according to claim 41.

43. A front projector comprising three display devices, each display device according to claim 41.

44. A rear projector comprising a display device according to claim 41.

45. A front projector comprising a display device according to claim 41.

46. A head mount display comprising a display device according to claim 41.

47. A computer comprising a display device according to claim 41.

48. A video camera comprising a display device according to claim 41.

49. A DVD player comprising a display device according to claim 41.

50. A game machine comprising a display device according to claim 41.

51. A display device comprising a semiconductor device according to claim 5.

52. A rear projector comprising three display devices, each display device according to claim 51.

53. A front projector comprising three display devices, each display device according to claim 51.

54. A rear projector comprising a display device according to claim 51.

55. A front projector comprising a display device according to claim 51.

56. A head mount display comprising a display device according to claim 51.

57. A computer comprising a display device according to claim 51.

58. A video camera comprising a display device according to claim 51.

59. A DVD player comprising a display device according to claim 51.

60. A game machine comprising a display device according to claim 51.

61. A display device comprising a semiconductor device according to claim 6.

62. A rear projector comprising three display devices, each display device according to claim 61.

63. A front projector comprising three display devices, each display device according to claim 61.

64. A rear projector comprising a display device according to claim 61.

65. A front projector comprising a display device according to claim 61.

66. A head mount display comprising a display device according to claim 61.

67. A computer comprising a display device according to claim 61.

68. A video camera comprising a display device according to claim 61.

69. A DVD player comprising a display device according to claim 61.

70. A game machine comprising a display device according to claim 61.

71. A display device comprising a semiconductor device according to claim 7.

72. A rear projector comprising three display devices, each display device according to claim 71.

73. A front projector comprising three display devices, each display device according to claim 71.

74. A rear projector comprising a display device according to claim 71.

75. A front projector comprising a display device according to claim 71.

76. A head mount display comprising a display device according to claim 71.

77. A computer comprising a display device according to claim 71.

78. A video camera comprising a display device according to claim 71.

79. A DVD player comprising a display device according to claim 71.

80. A game machine comprising a display device according to claim 71.

81. A display device comprising a semiconductor device according to claim 8.

82. A rear projector comprising three display devices, each display device according to claim 81.

83. A front projector comprising three display devices, each display device according to claim 81.

84. A rear projector comprising a display device according to claim 81.

85. A front projector comprising a display device according to claim 81.

86. A head mount display comprising a display device according to claim 81.

87. A computer comprising a display device according to claim 81.

88. A video camera comprising a display device according to claim 81.

89. A DVD player comprising a display device according to claim 81.

90. A game machine comprising a display device according to claim 81.

91. A display device comprising a semiconductor device according to claim 9.

92. A rear projector comprising three display devices, each display device according to claim 91.

93. A front projector comprising three display devices, each display device according to claim 91.

94. A rear projector comprising a display device according to claim 91.

95. A front projector comprising a display device according to claim 91.

96. A head mount display comprising a display device according to claim 91.

97. A computer comprising a display device according to claim 91.

98. A video camera comprising a display device according to claim 91.

99. A DVD player comprising a display device according to claim 91.

100. A game machine comprising a display device according to claim 91.

101. A display device comprising a semiconductor device according to claim 10.

102. A rear projector comprising three display devices, each display device according to claim 101.

103. A front projector comprising three display devices, each display device according to claim 101.

104. A rear projector comprising a display device according to claim 101.

105. A front projector comprising a display device according to claim 101.

106. A head mount display comprising a display device according to claim 101.

107. A computer comprising a display device according to claim 101.

108. A video camera comprising a display device according to claim 101.

109. A DVD player comprising a display device according to claim 101.

110. A game machine comprising a display device according to claim 101.

* * * * *